(12) United States Patent
Kobayashi et al.

(10) Patent No.: US 8,230,379 B2
(45) Date of Patent: Jul. 24, 2012

(54) LAYOUT GENERATING METHOD FOR SEMICONDUCTOR INTEGRATED CIRCUITS

(75) Inventors: Sachiko Kobayashi, Ichikawa (JP); Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 954 days.

(21) Appl. No.: 11/874,601

(22) Filed: Oct. 18, 2007

(65) Prior Publication Data

US 2008/0098341 A1    Apr. 24, 2008

(30) Foreign Application Priority Data

Oct. 20, 2006    (JP) .................................. 2006-286919

(51) Int. Cl.
*G06F 17/32* (2006.01)

(52) U.S. Cl. .......... 716/132; 716/126; 716/136; 716/139

(58) Field of Classification Search ................... 716/126, 716/132, 136, 139
See application file for complete search history.

(56) References Cited

U.S. PATENT DOCUMENTS

| | | | |
|---|---|---|---|
| 6,249,904 | B1 | 6/2001 | Cobb |
| 6,456,738 | B1 * | 9/2002 | Tsukasa ........................ 382/175 |
| 6,584,609 | B1 | 6/2003 | Pierrat et al. |
| 7,174,520 | B2 * | 2/2007 | White et al. ...................... 716/4 |
| 7,194,704 | B2 | 3/2007 | Kotani et al. |
| 2003/0226757 | A1 * | 12/2003 | Smith et al. ...................... 205/82 |
| 2005/0134866 | A1 | 6/2005 | Kyoh et al. |
| 2007/0051950 | A1 | 3/2007 | Kobayashi et al. |

FOREIGN PATENT DOCUMENTS

| | | |
|---|---|---|
| JP | 2002-006475 | 1/2002 |
| JP | 2002-543471 | 12/2002 |
| JP | 2003-167323 | 6/2003 |
| JP | 2003-525470 | 8/2003 |
| JP | 2003-322945 | 11/2003 |
| JP | 2004-030579 | 1/2004 |
| JP | 2005-148176 | 6/2005 |
| JP | 2005-181524 | 7/2005 |
| JP | 2005-181612 | 7/2005 |
| JP | 2006-023649 | 1/2006 |
| JP | 2006-053248 | 2/2006 |
| JP | 2007-256305 | 10/2007 |

OTHER PUBLICATIONS

Notice of Reasons for Rejection, issued by Japanese Patent Office, dated Nov. 15, 2011, in Japanese patent application No. 2007-269463 (4 pages).

* cited by examiner

*Primary Examiner* — Thuan Do
(74) *Attorney, Agent, or Firm* — Finnegan, Henderson, Farabow, Garrett & Dunner, L.L.P.

(57) ABSTRACT

A design layout generating method for generating a design pattern of a semiconductor integrated circuit is disclosed. This method comprises modifying a first modification area extracted from a design layout by a first modifying method, and modifying a second modification area extracted from the design layout so as to include the first modification area by a second modifying method on the basis of a pattern modifying guideline calculated from at least a partial design layout in the second modification area.

12 Claims, 17 Drawing Sheets

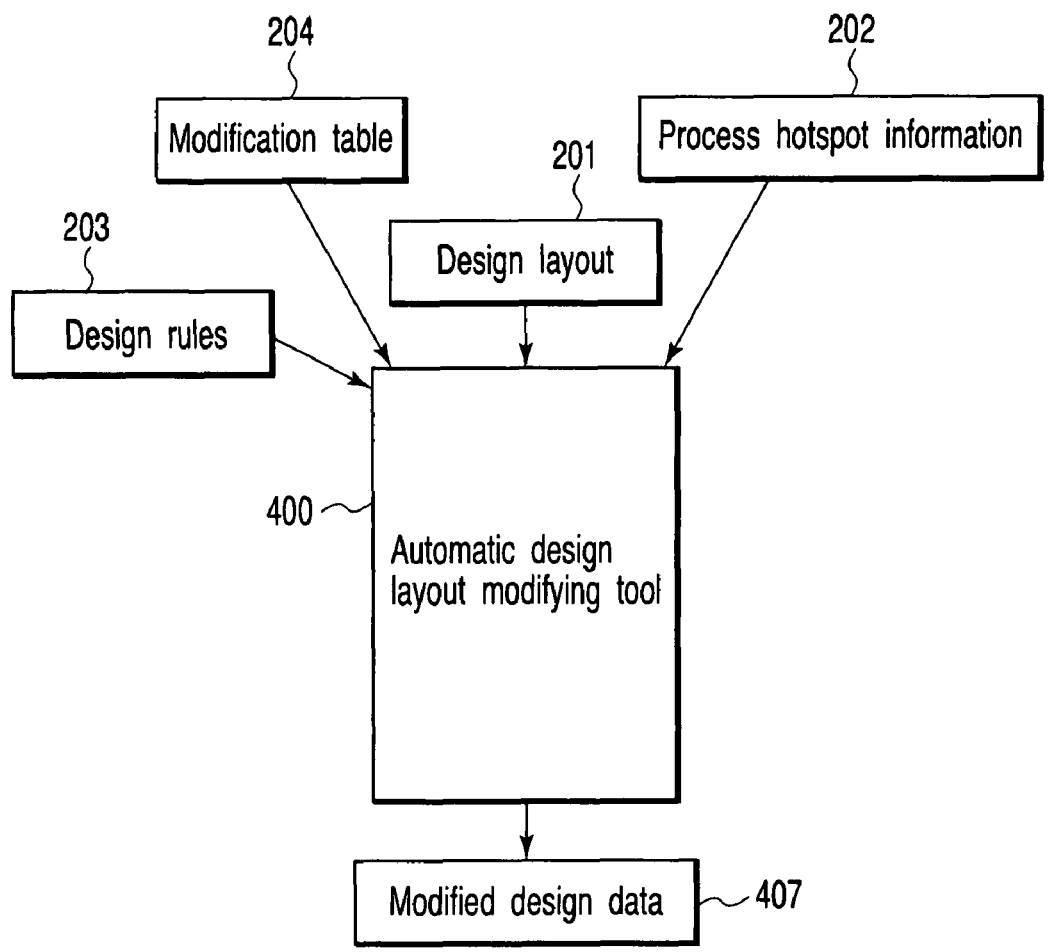
F I G. 4

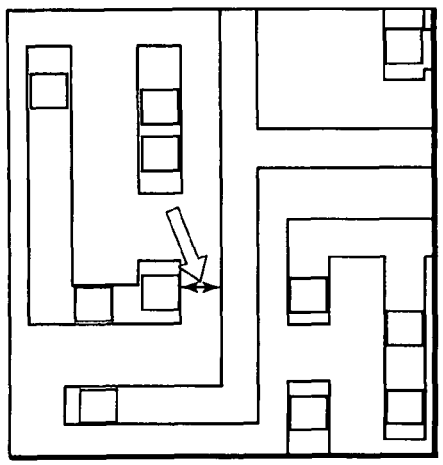
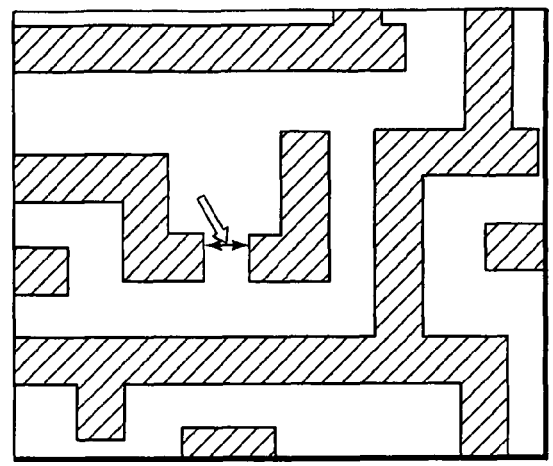
FIG. 6A        FIG. 6B
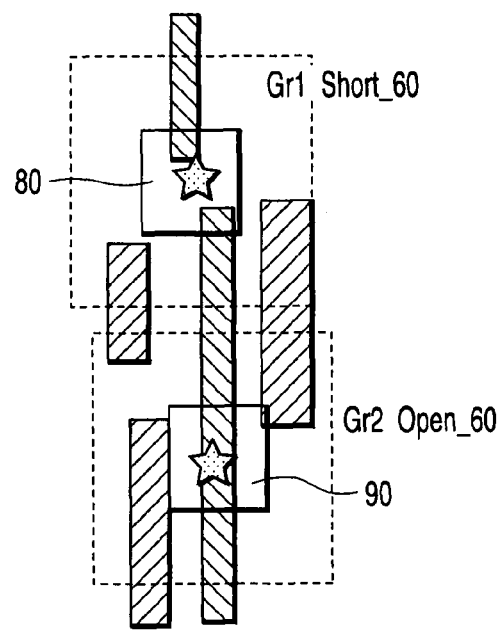
FIG. 7

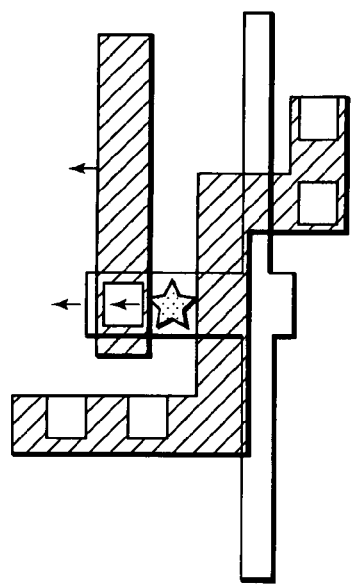 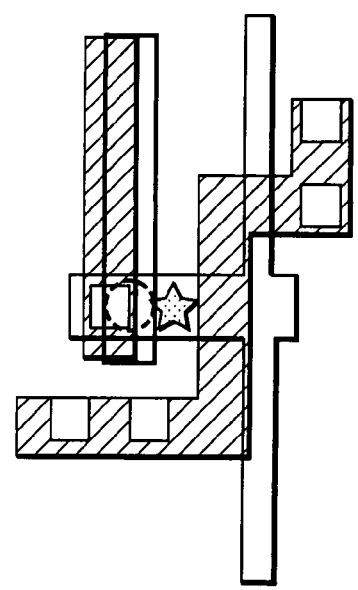
FIG. 19A    FIG. 19B
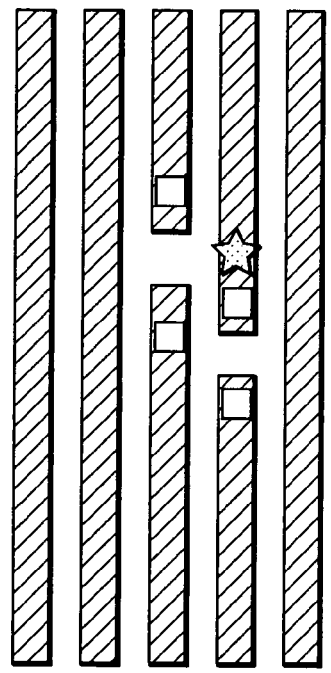 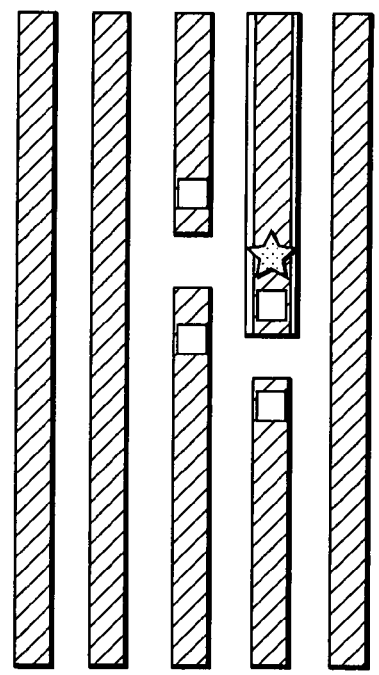
FIG. 20A    FIG. 20B

LAYOUT GENERATING METHOD FOR SEMICONDUCTOR INTEGRATED CIRCUITS

CROSS-REFERENCE TO RELATED APPLICATIONS

This application is based upon and claims the benefit of priority from prior Japanese Patent Application No. 2006-286919, filed Oct. 20, 2006, the entire contents of which are incorporated herein by reference.

BACKGROUND OF THE INVENTION

1. Field of the Invention

This invention relates to a design layout generating method of forming a design pattern of a semiconductor integrated circuit, and more particularly to the technique for modifying a generated design layout. This invention further relates to a semiconductor device manufacturing method of manufacturing semiconductor integrated circuit devices using the design layout generating method and to a computer-readable medium in which program instructions to be executed on a computer in the design layout generating method has been stored.

2. Description of the Related Art

In the design of semiconductor integrated circuits, it is necessary to conform to the design rules, which are the basic dimension rules for the smallest dimensions, space, shape, and others, determined taking device conditions and process conditions into account. However, even if the design data conforms to the design rules, pattern areas needing modification, for example, process hot spots, might be found as a result of running a process simulation after optical proximity correction (OPC)/resolution enhancement technology (RET) processing is conducted. Specifically, process hot spots include an unexpected spot where patterns make or might make contact with one another or break away or might break away as a result of the pattern width increasing or decreasing in a local part of the patterns, a spot where the line width or space width does not meet predetermined requirements, and a spot where the process margin is below a predetermined value.

A method has already been proposed which works out a table (a design layout change guideline) determining a design layout modification policy by repeatedly modifying at least one of the design rules, the process proximity correction parameter, and the semiconductor process parameter at hot spots and partially modifying the design layout on the basis of the provided design layout change guideline (for example, refer to Jpn. Pat. Appln. KOKAI Publication No. 2005-181524).

There are several methods of partially modifying the design layout. For instance, a method of deriving a pattern satisfying a specified condition by perturbing the edges constituting the pattern (for example, refer to Jpn. Pat. Appln. KOKAI Publication No. 2005-181612). Moreover, another method has been proposed which specifies the amount of modification of the line width or space width on the design layout at a process hot spot, thereby removing the hot spot.

Although the modifying methods are used, it may be impossible to correctly modify all the process hot spots in the input design data. For example, depending on the pattern layout near a process hot spot, the optimum pattern may not be included in the patterns generated by perturbation. Moreover, the amount of modification of the line width/space width may be too large or too small. In addition, a sufficient amount of modification may not be secured at a specified spot because of the limitation of the design rules.

As described above, with the conventional method of determining the amount of modification by reference to a table, the amount of modification may be insufficient/excessive, depending on the pattern. Consequently, the optimum modification may not be made.

BRIEF SUMMARY OF THE INVENTION

According to a first embodiment of the invention, there is provided a design layout generating method comprising modifying a first modification area extracted from a design layout by a first modifying method, and modifying a second modification area extracted from the design layout so as to include the first modification area by a second modifying method on the basis of a pattern modifying guideline calculated from at least a partial design layout in the second modification area.

According to a second embodiment of the invention, there is provided a semiconductor device manufacturing method comprising forming a photoresist layer on a processed material, exposing the photoresist layer using a photomask, forming a resist pattern by developing the exposed photoresist layer, and patterning the processed material by using the resist pattern as at least a part of the mask, the photomask having a pattern formed thereon on the basis of a design layout generated by a design layout generating method including modifying a first modification area extracted from a design layout by a first modifying method, and modifying a second modification area extracted from the design layout so as to include the first modification area by a second modifying method on the basis of a pattern modifying guideline calculated from at least a partial design layout in the second modification area.

According to a third embodiment of the invention, there is provided a computer-readable medium configured to store program instructions for execution on a computer, the program instructions causing the computer to perform modifying a first modification area extracted from a design layout by a first modifying method, and modifying a second modification area extracted from the design layout so as to include the first modification area by a second modifying method on the basis of a pattern modifying guideline calculated from at least a partial design layout in the second modification area.

BRIEF DESCRIPTION OF THE SEVERAL VIEWS OF THE DRAWING

FIG. 4 is a schematic diagram showing an automatic design-layout modifying tool for realizing a conventional design layout generating method;

FIGS. 6A and 6B are pattern plan views to help explain examples of being incapable of securing a sufficient amount of modification in a rule-based modification;

FIG. 7 is a pattern plan view to help explain a design layout generating method according to a second embodiment of the invention, showing a design layout where process hot spots have developed;

FIGS. 19A and 19B are pattern plan views showing examples of analyzing context, selecting an appropriate modifying method, and making a modification;

FIGS. 20A and 20B are pattern plan views showing other examples of analyzing context, selecting an appropriate modifying method, and making a modification;

DETAILED DESCRIPTION OF THE INVENTION

First Embodiment

Figure 1:
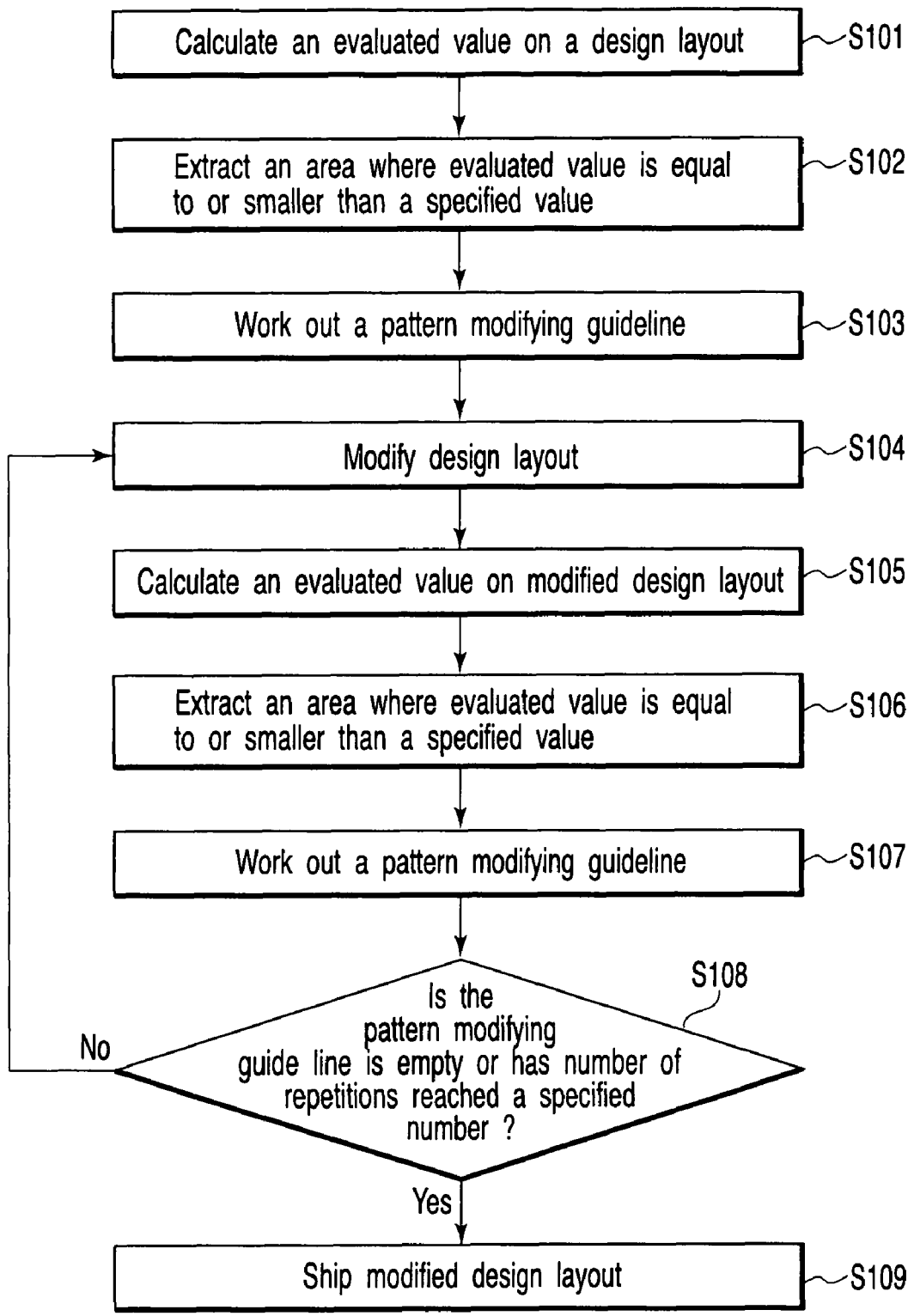
FIG. 1 is a flowchart to help explain a design layout generating method according to a first embodiment of the invention.
Figure 2:
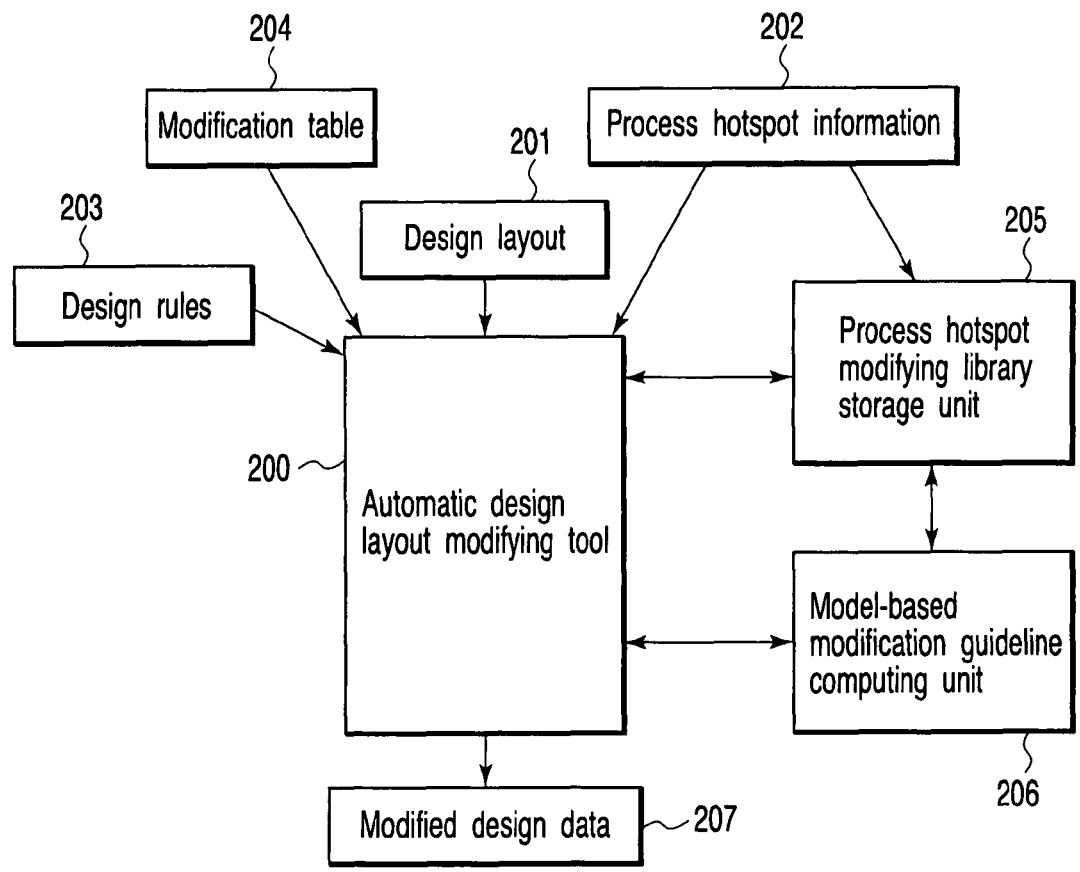
FIG. 2 is a schematic diagram showing the configuration of an automatic design-layout modifying tool and its peripheral circuitry which realize the design layout generating method according to the first embodiment.

FIG. 1 is a flowchart to help explain a design layout generating method according to a first embodiment of the invention. FIG. 2 is a schematic diagram showing the configuration of an automatic design-layout modifying tool 200 and its peripheral circuitry which realize the design layout generating method of FIG. 1.

First, a design layout 201 of a semiconductor integrated circuit is generated, conforming to design rules 203, the basic dimension rules for the minimum dimensions, space, shape, density, layout and other factors of patterns, determined taking device conditions and process conditions into account.

Next, a design layout 201, a test pattern simulating the design layout, or patterns obtained by subjecting these patterns to a Mask Data Preparation (MDP) process, OPC process, RET process, and the like are formed on a wafer by actual lithography. The dimensions are measured with a scanning electron microscope (SEM) or the like and a test is performed to measure the electrical characteristics. Alternatively, after a design layout 201 or a test pattern simulating the design layout is subjected to processes, including mask data preparation (MDP), OPC, and RET, thereby creating mask data, a process simulation is run. On the basis of the results of the processes, process hot spots are found which have the following problems: for example, patterns make contact with one another or break away at an unexpected spot, the line width or space width does not meet predetermined requirements, and the process margin is below a predetermined value.

Specifically, an evaluated value (a first evaluated value) for the process risk is calculated for each part of a pattern resulting from the test or simulation. Moreover, the same evaluated value is given to the design layout pattern corresponding to the pattern on the wafer whose evaluated value has been calculated (step S101 in FIG. 1).

The evaluated value acting as an index of risk can be formulated from the viewpoints of the error category of a pattern formed by a process simulation or the like, the dimensions, the number of edge placement errors (EPEs), the lithography margin for exposure focus and light exposure, the coverage with other layers, or a combination of these.

For example, in a case where the error category is a short error (which is such that a pattern supposed to be separated from an adjacent pattern is in danger of touching the adjacent pattern), if an ideal space width of 80 nm is decreased to 75 nm because of an edge placement error in a pattern on the one side of the space, 75/80 may be used as an evaluated value. In a case where the error category is an open error (which is such that a continuous line pattern is in danger of being broken), the value obtained by dividing an actual line pattern width by a design line pattern width may be used as an evaluated value. These cases are examples of the definition of an evaluated value which is such that the larger the evaluated value, the lower the risk.

Furthermore, the difference from the dimensional threshold of a lithographic simulation image may be ranked and the resulting value may be used as an evaluated value as described below.

Figure 5A:
FIG. 5A is a pattern plan view to help explain the relationship with the evaluated value for an open error in a line.

For example, in a case where the risk of an open error in a line pattern (arrow part) as shown in FIG. 5A is evaluated, ranking is done using evaluated values as shown in Table 1, with the 70-nm line width of a lithographic simulation image being a risk threshold. At this time, the line width dimension of the design line pattern is 100 nm.

TABLE 1

| Dimension (nm) | Evaluated value |
| --- | --- |
| Not less than 95 | 0 |
| Not less than 90 and less than 95 | 0.5 |
| Not less than 85 and less than 90 | 1 |
| Not less than 80 and less than 85 | 2 |
| Not less than 75 and less than 80 | 3 |

TABLE 1-continued

| Dimension (nm) | Evaluated value |
|---|---|
| Not less than 70 and less than 75 | 4 |
| Not less than 65 and less than 70 | 5 |
| Not less than 60 and less than 65 | 6 |
| Not less than 55 and less than 60 | 7 |
| Not less than 50 and less than 55 | 8 |
| Not less than 45 and less than 50 | 9 |
| Not less than 40 and less than 45 | 10 |
| Less than 40 | 11 |

Figure 5B:
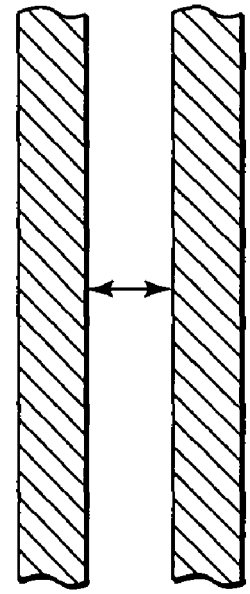
FIG. 5B is a pattern plan view to help explain the relationship with the evaluated value for a short error in a space.

For example, in a case where the risk of a short error in a space (arrow part) as shown in FIG. 5B is evaluated, ranking is done using evaluated values as shown in Table 2, with the 55-nm space dimension of a lithographic simulation image being a risk threshold. At this time, the design space dimension is 100 nm.

TABLE 2

| Dimension (nm) | Evaluated value |
|---|---|
| Not less than 80 | 0 |
| Not less than 75 and less than 80 | 0.5 |
| Not less than 70 and less than 75 | 1 |
| Not less than 65 and less than 70 | 2 |
| Not less than 60 and less than 65 | 3 |
| Not less than 55 and less than 60 | 4 |
| Not less than 50 and less than 55 | 5 |
| Not less than 45 and less than 50 | 6 |
| Not less than 40 and less than 45 | 7 |
| Not less than 35 and less than 40 | 8 |
| Not less than 30 and less than 35 | 9 |
| Not less than 25 and less than 30 | 10 |
| Less than 25 | 11 |

Figure 5C:
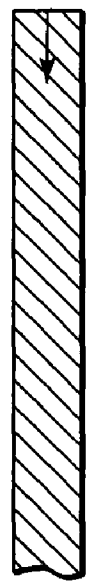
FIG. 5C is a pattern plan view to help explain the relationship with the evaluated value for a line end shortening error.

For example, in a line end shortening error in a line pattern end (arrow part) as shown in FIG. 5C, ranking is done using evaluated values as shown in Table 3, with the 50-nm degenerate dimension of a lithographic simulation image being a risk threshold.

TABLE 3

| Dimension (nm) | Evaluated value |
|---|---|
| Less than 30 | 0 |
| Not less than 30 and less than 35 | 1 |
| Not less than 35 and less than 40 | 2 |
| Not less than 40 and less than 45 | 3 |
| Not less than 45 and less than 50 | 4 |
| Not less than 50 and less than 55 | 5 |
| Not less than 55 and less than 60 | 6 |
| Not less than 60 and less than 65 | 7 |
| Not less than 65 and less than 70 | 8 |
| Not less than 70 | 9 |

Moreover, for example, in the result of lithographic simulation, the contrast of the object edge of a transcription pattern or the slope of an optical image of a transcribed pattern (the rate of change of the intensity of an optical image with a intensity threshold value with which the optical image is transcribed onto a wafer) may be ranked and the resulting value may be set as an evaluated value.

For example, ranking is done using evaluated values as shown in Table 4, with a slope of 0.6 (in arbitrary units) of an image being a risk threshold.

TABLE 4

| Slope (arbitrary unit) | Evaluated value |
|---|---|
| Not less than 0.8 | 0 |
| Not less than 0.7 and less than 0.8 | 1 |
| Not less than 0.6 and less than 0.7 | 3 |
| Not less than 0.5 and less than 0.6 | 5 |
| Not less than 0.4 and less than 0.5 | 7 |
| Not less than 0.3 and less than 0.4 | 9 |
| Less than 0.3 | 10 |

For example, ranking is done using evaluated values as shown in Table 5, with a slope of 0.6 (in arbitrary units) of an image being a risk threshold.

TABLE 5

| Contrast (arbitrary unit) | Evaluated value |
|---|---|
| Not less than 0.8 | 0 |
| Not less than 0.7 and less than 0.8 | 1 |
| Not less than 0.6 and less than 0.7 | 3 |
| Not less than 0.5 and less than 0.6 | 5 |
| Not less than 0.4 and less than 0.5 | 7 |
| Not less than 0.3 and less than 0.4 | 9 |
| Less than 0.3 | 10 |

The above cases where ranking is done and the resulting values are set as evaluated values (as shown in Table 1 to Table 5) are examples of the definition of an evaluated value which is such that the larger the evaluated value, the lower the risk.

When evaluated values are calculated, a process simulation may be run under a plurality of focus conditions and a plurality of light exposures, thereby measuring the pattern dimensions, process margins, and edge placement errors and combining the resulting values to find evaluated values.

In the first embodiment described below, an explanation will be given, provided that the larger the evaluated value, the lower the risk.

After step S101, an area (a first modification area) of the design layout is extracted which corresponds to an area including a pattern where the evaluated value (a first evaluated value) calculated in step S101 does not satisfy a specified condition (that is, the evaluated value is equal to or smaller than a specific threshold value) and the risk is higher than a specific level (step S102). Information on the result of the extraction, that is, information on the position of the modification area and its evaluated value is process hot spot information 202 (modification area information) in FIG. 2.

While in the first embodiment, an area including a process hot spot in the design layout is set as a modification area, a modification area may not always be an area including a process hot spot. An area including an arbitrary design pattern may be set as a modification area. Moreover, a pattern may be so modified that the evaluated value of the pattern of the modification area after modification is higher than that before modification (or the evaluation is improved).

Then, as shown in FIG. 2, a design layout 201, process hot spot information 202, design rules 203, and a modification table 204 are input to an automatic design-layout modifying tool 200. In the modification table 204, the amount of modification for each layout pattern determined in reference to the process hot spot information 202, or a modifying method, has been written. In the automatic design-layout modifying tool 200, for example, a computer has been realized by an executable program.

On the basis of these pieces of information, the automatic design-layout modifying tool 200 works out a pattern modifying guideline (not shown) in which a quantitatively modifying method of thickening, thinning, or deforming a pattern has been written concretely (step S103). Since the modification is made on the basis of the modification table 204 of the modification rules predetermined for layout information including the pattern width, it is a rule-based modification.

At this time, for example, the process hot spot information 202 and pattern modifying guideline are stored in a process hot spot modifying library storage unit 205. The process hot spot modifying library storage unit 205 is realized by, for example, a hard disk connected to the commuter or a storage medium, such as a memory.

Then, the automatic design-layout modifying tool 200 modifies the design layout 201 on the basis of the worked-out pattern modifying guideline and generates a modified design layout (not shown) (step S104).

Next, the automatic design-layout modifying tool 200 extracts the layout of an area including a modification area from the modified design layout to be modified and inputs the extracted layout to a model-based modification guideline computing unit 206. The model-based modification guideline computing unit 206 is realized by, for example, a computer-executable program.

The model-based modification guideline computing unit 206 subjects the design layout of a part to be modified to mask data preparation (MDP), optical proximity correction (OPC), resolution enhancement technology (RET) processing, and others to create mask value data and runs a process simulation of the mask value data to create predictive data on a pattern formed on the wafer.

Next, the model-based modification guideline computing unit 206 calculates an evaluated value (a second evaluated value) on the basis of the predictive pattern on the wafer for the input design layout (step S105). The same reference as the evaluated value found in step S101 may be used as an evaluated value used here.

Then, an area (or a process hot spot) where the evaluated value is still equal to or smaller than a specific threshold value is further extracted from the modification area (the first modification area) of the modified design layout (step S106) and a pattern modifying guideline (not shown) for the extracted process hot spot (a second modification area) is worked out (step S107). The part where the evaluated value is larger than the specific threshold value needs no subsequent modification and a pattern modifying guideline for it is not worked out.

Like the first modification area, the extracted second modification area may not necessarily include a process hot spot. Moreover, the second modification area may be an area including at least a part of the first modification area or be larger or smaller than the first modification area.

In step S107, a pattern modifying guideline is automatically worked out using an automatic modifying model based on a specific algorithm. Specifically, in the conventional art, the modifier (designer) creates a new modification table on the basis of the result of layout modification or modifies the pattern suitably by trial and error. In the first embodiment, however, a suitable modifying guideline can be calculated automatically by applying a specified algorithm according to the layout of the modification area. For example, a pattern modifying guideline is worked out according to a fluctuation in the evaluated value before and after a modification in the layout modified area. That is, a modifying guideline to further promote a modification may be provided for a part where a decrease in the risk is insufficient in the process hot spot extracted after the modification in step S104. For example, if a modification is made insufficiently and a short error still remains in a part where a short error has occurred, or if there is almost no change in the evaluated value of a short error, the amount of modification of edge movement may be increased as compared with the preceding modification or edges to be modified may be increased. Moreover, in a part where the risk of the modification area has increased before and after the modification, that is, the evaluated value has decreased, the edges may be moved in a direction of modification differing from the direction in which the edges were modified last time. In this way, a modifying method at each hot spot is worked out concretely according to a specified algorithm for all of the process hot spots and a pattern modifying guideline which enumerates them is worked out (step S107).

The model-based modification guideline computing unit 206 may store information on the position of a process hot spot and its evaluated value and the pattern modifying guideline obtained in steps S105 to S107 into the process hot spot modifying library storage unit 205 (modifying library storage unit) as history information.

Thereafter, the model-based modification guideline computing unit 206 sends the pattern modifying guideline worked out in step S107 to the automatic design-layout modifying tool 200.

The automatic design-layout modifying tool 200 determines whether the pattern modifying guideline sent from the model-based modification guideline computing unit 206 is empty, or a method of modifying a hot spot has not been written at all, in other word, whether hot spots have disappeared as a result of the preceding modification, or the number of times the model-based modification guideline computing unit 206 worked out pattern modifying guidelines has reached a specific value (step S108).

If it has been determined in step S108 that the pattern modifying guideline is empty, the design layout modified just before in step S104 is set as the modified design layout and shipped to the semiconductor device manufacturer (step S109).

If it has not been determine in step S108 that the pattern modifying guideline is empty, a modifying guideline is newly worked out for the pattern modifying guideline worked at in step S107 and on the basis of the guideline, the design layout is modified (step S104). The process of modifying the design layout and the process of extracting hot spots and updating the modified guideline are repeated a specific number of times or until hot spots have disappeared, which realizes a decrease in the number of process hot spots and a reduction in the risk.

In the model-based modifying method executed on the model-based modification guideline computing unit 206, after mask value data is created for the result of the modification as described above, a process simulation is run and the risk is evaluated. If any process hot spot remains, the modifying work is repeated according to a specified algorithm. Accordingly, the design layout can be optimized automatically.

Figure 3:
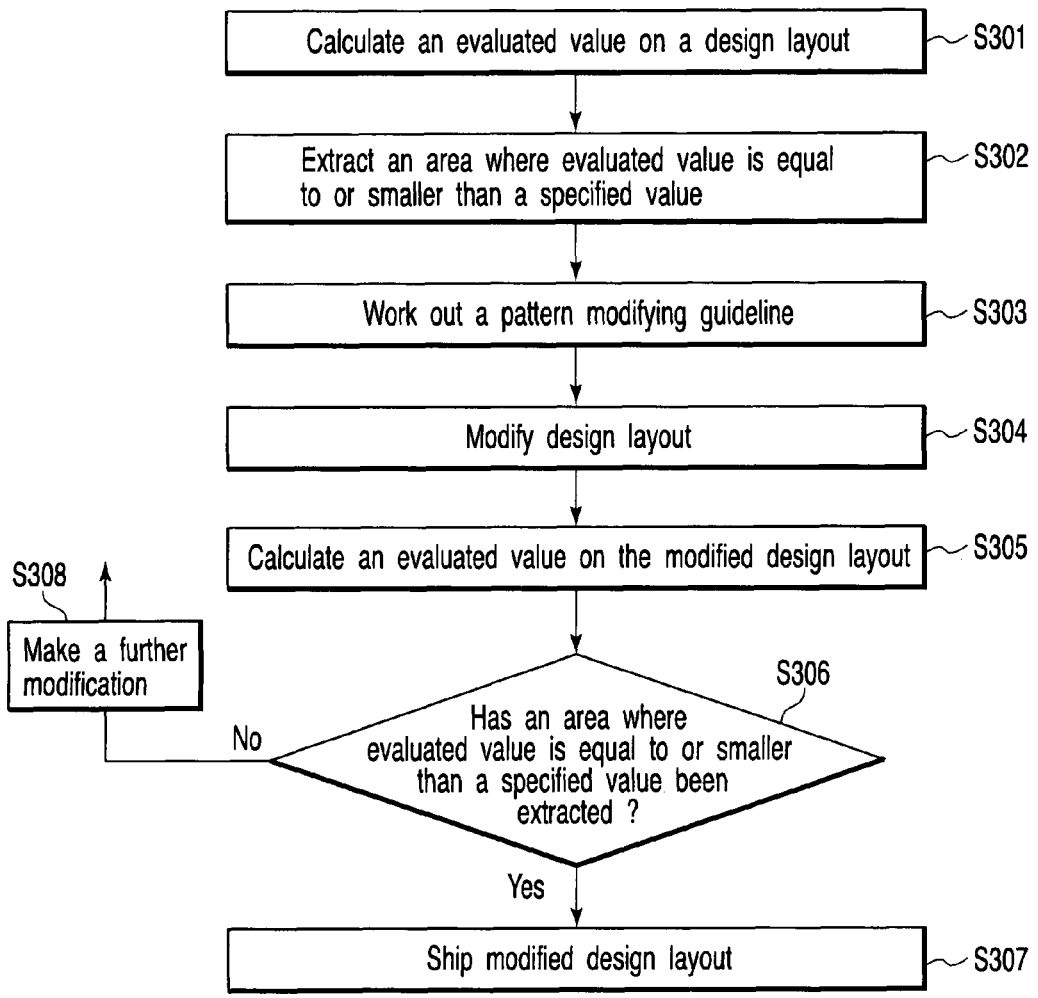
FIG. 3 is a flowchart to help explain a conventional design layout generating method.

For comparison, a conventional design layout generating method of modifying process hot spots using only a rule-based modifying method will be explained. FIG. 3 is a flowchart to help explain a conventional design layout generating method. FIG. 4 shows the input-output relation of an automatic design-layout modifying tool 400 which realizes the design layout generating method shown in FIG. 3.

In FIG. 3, the processes in steps S301 to S304 are the same as those in steps S101 to S104 of the first embodiment.

Specifically, as shown in FIG. 4, the design data 201, process hot spot information 202, design rules 203, and modification table 204 are input to the automatic design-layout modifying tool 400. On the basis of these pieces of information, the automatic design-layout modifying tool 400 works out a pattern modifying guideline (not shown) (step S303).

Then, on the basis of the worked-out pattern modifying guideline, the automatic design-layout modifying tool 400 modifies the design layout 201 and works out a modified design layout (not shown) (step S304).

Next, the automatic design-layout modifying tool 400 subjects the modified design layout to mask data preparation (MDP), optical proximity correction (OPC), resolution enhancement technology (RET) processing, and others to create mask value data and runs a process simulation of the mask value data to create predictive data on a pattern formed on the wafer. Moreover, the automatic design-layout modifying tool 400 calculates an evaluated value of the risk of a process hot spot of the predictive pattern on the wafer for the modified design layout (step S305).

Then, the automatic design-layout modifying tool 400 determines whether an area where the evaluated value is equal to or smaller than a specified threshold value (or a process hot spot) has been extracted from the modified design layout (step S306).

If no process hot spot has been extracted in step S306, the modified design layout is shipped (step S307). If a process hot spot has been extracted, the designer has to further perform processing from a suitable step after further making modifications, including modifying the design data, adjusting the modification table, and making adjustments before and after the stipulation of the pattern modifying guideline (step S308).

Specifically, in the rule-based modification, process hot spots might be modified insufficiently, depending on the shape of a pattern. If the amount of modification is increased to compensate for the insufficiency, a new process hot spot might develop. FIGS. 6A and 6B show cases where the amount of modification of the space width of a wafer transcription pattern is so small that a sufficient amount of modification cannot be secured.

In FIGS. 6A and 6B, process hot spots where the process margin is so small that a short error is liable to occur on the wafer are shown by arrows.

In the example of FIG. 6A, since the space width of a predictive pattern on the wafer based on the layout with a design pattern space width of 100 nm was 65 nm, a modification was made by moving the right-side edge 10 nm to extend the space, referring to the pattern modification table 1 shown in Table 6 from the space dimensions of the predictive pattern and the pattern layout situation. However, when the dimensions on the wafer were estimated for the modified pattern, it was found that the dimensions of the space were still insufficient and there was insufficient process margin.

TABLE 6

| Error category | Dimension | Modified spot | Amount of modification |
|---|---|---|---|
| Short | 65 nm | Space | 10 nm |
| Short | 70 nm | Space | 5 nm |

In FIG. 6B, a modification was made, referring to the pattern modification table 1 shown in Table 6 from the space dimensions of the predictive pattern on the wafer and the pattern layout situation. Specifically, since the space width of a predictive pattern was 70 nm, a modification was made by moving the left-side edge 5 nm to extend the space by 5 nm. However, when the dimensions on the wafer were estimated for the modified pattern, it was found that the dimensions of the space were still insufficient and there was insufficient process margin.

In these patterns, to allow a sufficient process margin, the amount of modification determined on the basis of the dimensions predicted to be formed on the wafer and the pattern layout situation was increased by 5 nm for each item, thereby forming a pattern modification table 2 shown in Table 7. When a modification was made referring to Table 7, it was found that the open margin of a pattern near a modified spot decreased and a new process hot spot occurred in another process hot spot.

TABLE 7

Amount-of-modification Table 2 (extract)

| Error category | Dimension | Modified spot | Amount of modification |
|---|---|---|---|
| Short | 65 nm | Space | 15 nm |
| Short | 70 nm | Space | 10 nm |

As described above, in the conventional design layout generating method based on the rule-based modifying method using a modification table, when a process hot spot remains after modification, it takes a lot of trouble to make a further modification and carry out the processes again. Moreover, when the medication table encounters an unexpected pattern layout, a trial and error process, including the change of the design and the correction of the modification table, is needed, resulting in the problem of requiring a lot of time.

However, in the design layout generating method of the first embodiment, a process hot spot which could not be modified by the rule-based modifying method is modified by an automatic modification model (or the model-based modifying method). Since the model-based modifying method can modify a process hot spot which could not be modified by the rule-based method automatically more quickly than the rule-based method, the design layout can be modified at a high speed with a high accuracy by a design layout generating method of the first embodiment which is a combination of both modifying methods.

The computer which can execute a program that realizes the function of the automatic design layout modifying tool 200 and that of the model-based modification guideline computing unit 206, the hard disk connected to the computer, and the process hot spot modifying library storage unit 205 realized by a storage medium, such as a memory, are realized a single computer system as a whole.

The design layout generating method of the first embodiment particularly has the advantages of being capable of making modifications at a high speed with a high accuracy according to design requirements and process requirements at a spot where the process margin in the manufacture of semiconductor devices is small. Moreover, suitably setting an evaluated value serving as the index of risk makes it possible to optimize the design layout efficiently. Furthermore, it is possible to shorten the time required to optimize the design layout by recycling the process hot spot modifying library in which the modifying guideline and the history of evaluated values or the like of the layout modified on the basis of the guideline have been recorded, that is by working out a pattern modifying guideline on the basis of information on the past modification history.

Consequently, manufacturing semiconductor devices by the design layout generating method of the first embodiment capable of high-speed modifications makes it possible to shorten the turnaround time needed for the creation of design layout data and reduce the cost. At the same time, the design layout can be modified with a high accuracy, which enables the yield of semiconductor devices to be improved.

A semiconductor device can be manufactured by forming a photoresist layer on a processed-material, exposing the photoresist layer using a photomask on which a pattern id formed on the basis of a design layout generated by a design layout generating method including modifying a first modification area extracted from a design layout by a first modifying method and modifying a second modification area extracted from the design layout so as to include the first modification area by a second modifying method on the basis of a pattern modifying guideline calculated from at least a partial design layout in the second modification area, forming a resist pattern by developing the exposed photoresist layer, and patterning the processed material by using the resist pattern as at least a part of the mask.

Second Embodiment

A design layout generating method according to a second embodiment of the invention will be explained using FIGS. 7 to 9, FIGS. 10A to 10D, and Tables 8 and 9.

In the second embodiment, an explanation will be given about a method of modifying a design pattern by repeating the following steps: working out a pattern modifying guideline for the area of a design layout extracted as a process hot spot from the process hot spot information (or information on a process hot spot and an evaluated value) obtained in step S106 of FIG. 1 (step S107), carrying out step S108, modifying the design layout (step S104), computing an evaluated value (step S105), extracting the process hot spot (step S106), and working out a pattern modifying guideline again (step S107).

If the evaluated value calculated in step S105 does not satisfy a specified condition at a specific spot, that is, if the risk at the specific spot is high because the evaluated value is smaller than a specified threshold value, an error marker indicating the coordinates of the specific spot is allocated. That is, an error marker is allocated to the process hot spot extracted in step S106.

In FIG. 7, two process hot spots have developed in the layout. The stars are error markers showing process hot spots. In the second embodiment, each error marker has a category indicating a short error or an open error and a class (evaluated value) indicating the risk as attributes.

Next, to modify the individual process hot spots indicated by the error markers, edges considered to contribute to the risk of a process hot spot are selected. Specifically, for example, neighborhoods 80, 90, the adjacent areas centering on the coordinates shown by the error markers, are set. Edges overlapping with the neighborhoods 80, 90 are extracted on a marker basis and then grouped. Information on the edge belonging to each error marker is stored together with the attribute of the error marker into the process hot spot modifying library storage unit 205 shown in FIG. 2. In Table 8, an example of the data stored here is shown.

TABLE 8

| Group | Category | Class | Edge |
|---|---|---|---|
| 1 | Short | 60 | |
| | | | 81 |
| | | | 82 |
| | | | 83 |
| | | | 84 |
| | | | 85 |
| | | | 86 |

TABLE 8-continued

| Group | Category | Class | Edge |
|---|---|---|---|
| 2 | Open | 60 | |
| | | | 91 |
| | | | 92 |
| | | | 93 |
| | | | 94 |
| | | | 95 |
| | | | 96 |

Figure 8:
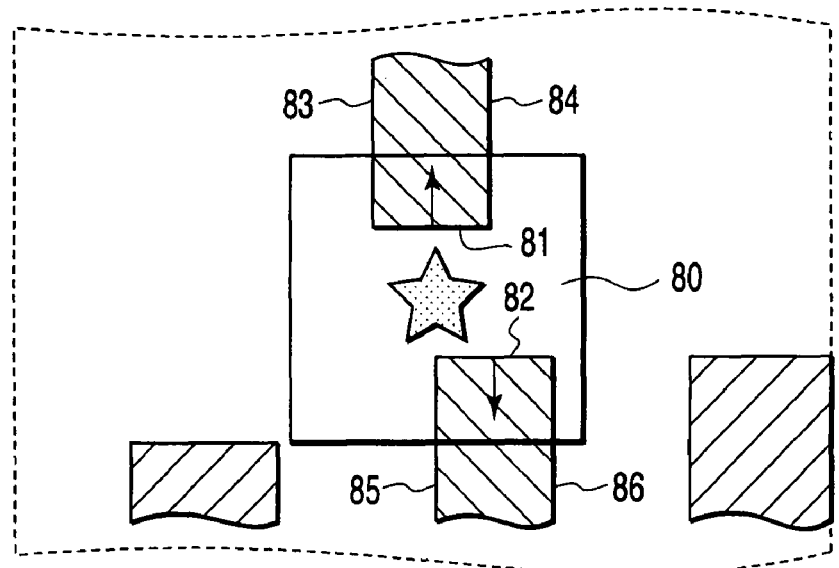
FIG. 8 is an enlarged pattern plan view of a short error spot in FIG. 7.
Figure 9:
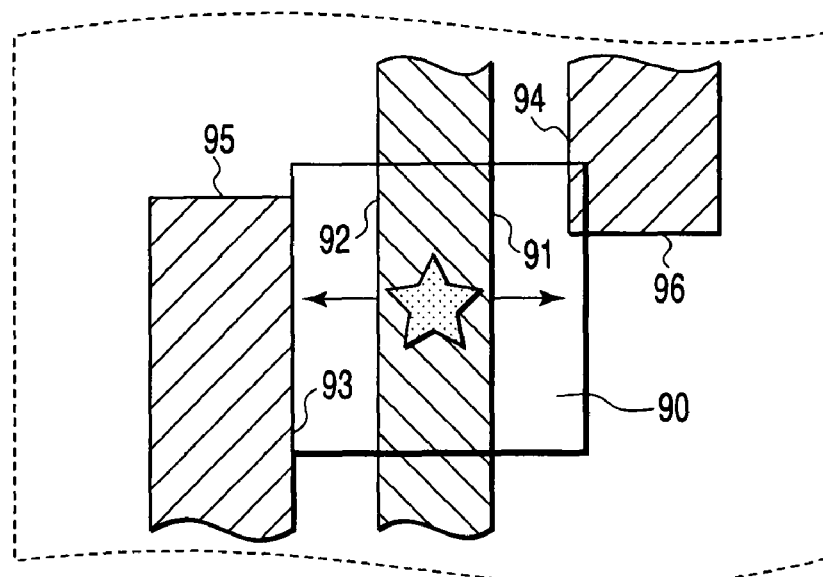
FIG. 9 is an enlarged pattern plan view of an open error spot in FIG. 7.

FIG. 8 is an enlarged view of a short error spot of FIG. 7.
FIG. 9 is an enlarged view of an open error spot.

In FIG. 8, a short error where the adjacent upper and lower patterns including edges 81, 82 respectively might make contact with each other has occurred at the spot shown by an error marker represented by a star. To modify this, the edges 81 to 86 in the vicinity of the error marker are extracted and moved in a direction in which the risk decreases. The edges in the vicinity of the error marker may be edges overlapping with the neighborhood 80 in a specified range from the center of the error marker. They are numbered and prioritized for use.

In the example of FIG. 8, the edges 81, 82 closest to the error marker were set as high-priority edges and the remaining edges 83 to 86 were set as normal-priority edges. Each time a routine of steps S104 to S108 is carried out, the space is made larger by moving one or more of the high-priority edges 81, 82 by a specific unit according to the class (evaluated value) of hot spots. If it is determined that the edges 81, 82 cannot be moved any more or their movement is inadequate because of the peripheral layout situation or the like, or if it is determined that the risk does not decrease sufficiently by only the modification of the edges 81, 82, one or more edges are selected from the normal-priority edges (or non-closest edges) 83 to 86 and moved in a direction in which the pattern gravity center separates from the marker. The peripheral layout situation is in a situation uncorrectable if a design rule in a layer is kept, or if a design rule with an upper layer and a design rule with a lower layer are kept. For example, it is in the situation where the edge cannot be moved any more in order to keep step coverage rule to via hole.

In FIG. 9, an open error where patterns might break has occurred at the spot shown by an error marker represented by a star. To modify this, edges 91 to 96 in the vicinity of the error marker are extracted and moved in a direction in which the risk decreases. The edges in the vicinity of the error marker may be edges overlapping with the neighborhood 90 in a specified range from the center of the error marker. They are numbered and prioritized for use. They may be prioritized in order of patters closer to the error marker.

In the example of FIG. 9, the edges 91, 92 closest to the error marker were set as high-priority edges and the remaining edges 93 to 96 were set as normal-priority edges. Each time a routine of steps S104 to S108 is carried out, the line width is made greater by moving one or more of the high-priority edges 91, 92 by a specific unit according to the class (evaluated value) of hot spots. If it is determined that the edges 91, 92 cannot be moved any more or their movement is inadequate because of the peripheral layout situation or the like, or if it is determined that the risk does not decrease sufficiently by only the modification of the edges 91, 92, one or more edges are selected from the normal-priority edges (or non-closest edges) 93 to 96 and moved in a direction in which the process hot spot pattern can be thickened. Thereafter, the high-priority edges 91, 92 are moved in a direction in which the line width becomes greater.

The amount of modification of the edges and the direction explained above are worked out as a pattern modifying guideline (step S107) according to a specified algorithm on the basis of the evaluated value (step S105) calculated each time the design layout is modified (step S104).

Moreover, as explained in the first embodiment, the error category of a pattern predicted by a process simulation, the dimensions, the number of edge placement errors (EPEs), the lithographic process margin for focus and exposure direction, the coverage with other layers, or a combination of these can be used as an evaluated value representing risk.

An example of automatically modifying the design pattern at the short error spot shown in FIG. 8 will be explained in further detail using FIG. 10A and Table 9.

The category of the process hot spot in FIG. 8 is a short error and the class (or evaluated value) showing risk is 60. If the class exceeds 80, it is determined that there is no risk. Here, the edges constituting the layout near a hot spot are put together to form group 1. To modify the group, the edges are moved.

Table 9 shows how much the individual edges belonging to group 1 where the short error in Table 8 occurred were moved by the individual processes and, after the result of the processes, what happened to the class of group 1, or the class of the short error, together with the progress of the processes. The signs of the amount of movement of edges are such that a direction in which the edges get away from the error marker is minus (−) and a direction in which they approach the error marker is plus (+). Hereinafter, a method of modifying a design pattern will be explained according to Table 9.

TABLE 9

| Group | Category | Class | Edge | Process 1 | Process 2 | Process 3 | Process 4 |
|-------|----------|-------|------|-----------|-----------|-----------|-----------|
| 1     | Short    | 60    |      | 65        | 69        | 75        | 80        |
|       |          |       | 81   | −5        | −10       | −10       | −10       |
|       |          |       | 82   | −5        | −5        | −10       | −10       |
|       |          |       | 83   |           |           |           | −5        |
|       |          |       | 84   |           |           |           | +5        |
|       |          |       | 85   |           |           |           |           |
|       |          |       | 86   |           |           |           |           |

Figure 10A:
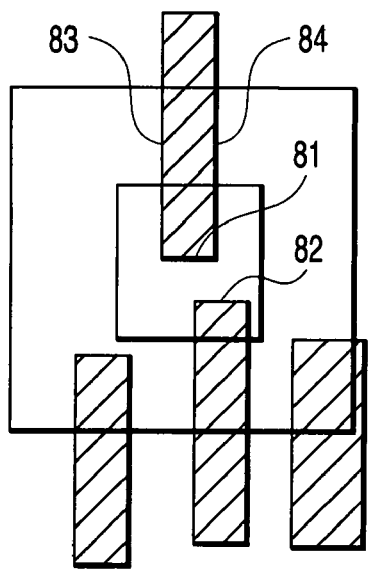
FIGS. 10A to 10D are pattern plan views to help explain a design layout generating method according to the second embodiment, showing an example of automatic design modification of a short error spot shown in FIG. 8.
Figure 10B:
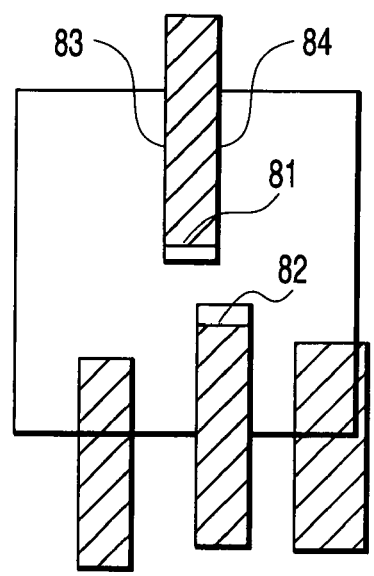
Figure 10C:
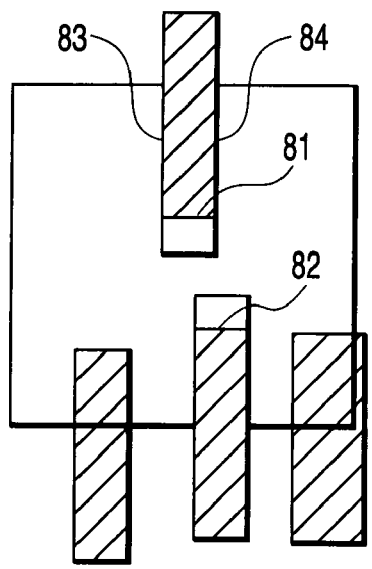

First, in the process 1, the edges 81, 82 in a pattern where a short error has occurred as shown in FIG. 10A are moved 5 nm in a direction in which the edges are retreated from the error marker as shown in FIG. 10B (step S104) according to the worked-out pattern modifying guideline (step S107). As a result, the class (or evaluated value) of the spot calculated on the basis of the predictive data obtained by subjecting the modified pattern to the mask data preparation and process simulation is 65 (step S105), which decreases the risk. However, the class is still equal to or smaller than 80 and therefore it cannot be said that the risk has been decreased sufficiently.

In the process 2, when the edge 81 was moved 10 nm in a direction in which the edge was retreated from the error marker, the class of the error was 69.

In the process 3, when the edge 82 was further moved and the edges 81, 82 were moved 10 nm in a direction in which they were retreated from the error marker, the class of the risk was 75.

Figure 10D:
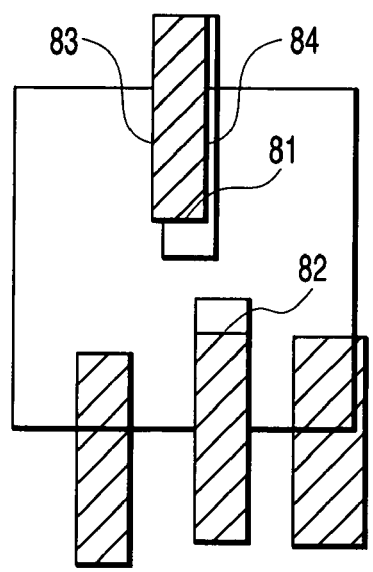

In the process 4, it was determined that the edges 81, 82 could not be moved any more because of the peripheral layout situation or the like. Then, as shown in FIG. 10D, the edges 83, 84 were moved to the left so as to separate the pattern gravity center from the error marker. In this case, the edge 83 was moved 5 nm in a direction in which it separated from the error marker and the edge 84 was moved 5 nm in a direction in which it approached the error marker. As a result of the modification, the class representing the risk was 80, meaning that there was no risk. Therefore, the process hot spot indicated by the error marker disappeared. The design pattern for an open error spot shown in FIG. 9 is also modified automatically in the same procedure as described above.

As in the process 4, when it is determined that the original modifying method cannot be carried out any more because of the peripheral layout situation or the like, when the risk does not decrease sufficiently only by the original modifying method, that is, a decrease in the risk is smaller than the threshold value, or when a decrease in the risk is smaller than the threshold value after several iterations, use of a modification promoting algorithm can be considered.

As an example, the way jogs are added to edges to be modified by a modification promoting algorithm in the middle of modification in automatically modifying a design pattern where a shortening error has occurred at the line end are shown in FIGS. 11A to 11D.

Figure 11A:
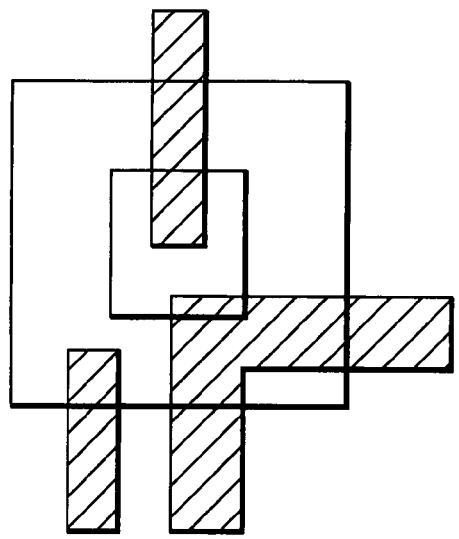
FIGS. 11A to 11D are pattern plan views to help explain another design layout generating method according to the second embodiment.
Figure 11B:
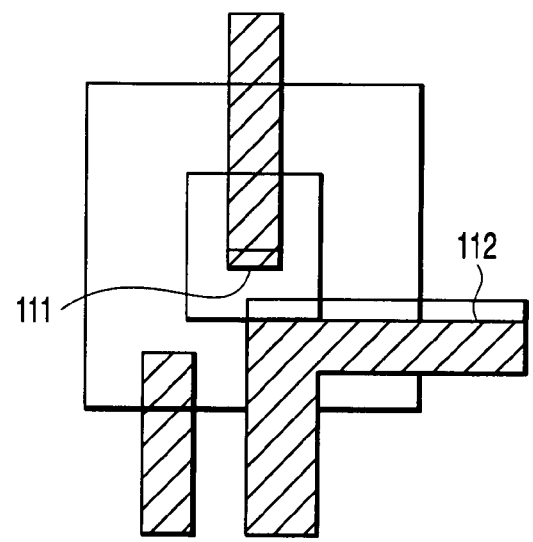
Figure 11C:
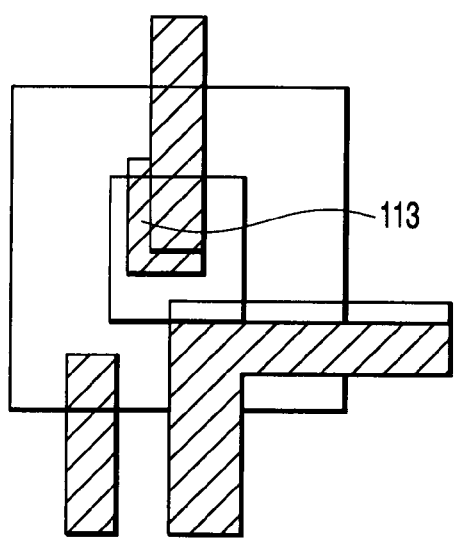
Figure 11D:
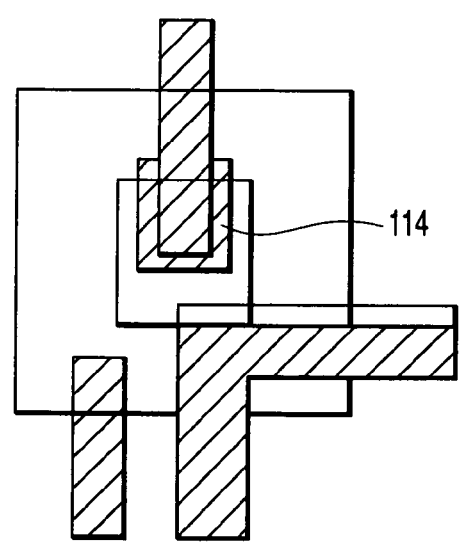

In a situation of FIG. 11A where a shortening error has occurred in the predictive pattern on the wafer, an edge 111 is moved downward to compensate for the shortness of a line and an edge 112 is also moved downward to widen the space as shown in FIG. 11B. However, since the shortening error is still corrected insufficiently, the pattern is modified in such a manner that jogs 113, 114 are added to the edges as shown in FIGS. 11C and 11D using a modification promoting algorithm.

Moreover, when there is insufficient space for modification at a hot spot and its vicinity or when the risk does not decrease even after the edges near the hot spot are modified, the following can be considered: the selection range of edges to be modified is made larger than the adjacent area, a spot contributing to a hot spot is searched for, and the spot is modified.

Figure 12A:
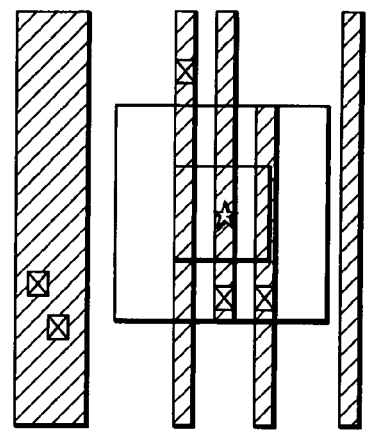
FIGS. 12A to 12C are pattern plan views to help explain still another design layout generating method according to the second embodiment.

In the example of FIG. 12A, an open error shown by an error marker represented by a star can be modified by thickening the line pattern near the error spot. However, since there is insufficient space for modifying a hot spot in its vicinity and there is a restriction on the positional relationship with another layer, sufficient modifications cannot be made. Moreover, because of a limitation on the positions of figures in the layer to be modified or a restriction on the positions of figures in the upper and lower layers, the figures might not be modified sufficiently.

Figure 12B:
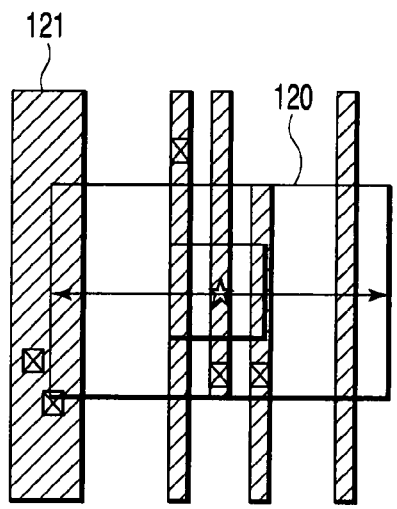

As described above, when the risk cannot be decreased by modifying the pattern edges in the vicinity, a spot contributing to the occurrence of an open error shown by an error marker is searched for by the modification promoting algorithm, enlarging the range 120 of the selection of edges to be modified as shown in FIG. 12B.

Figure 12C:
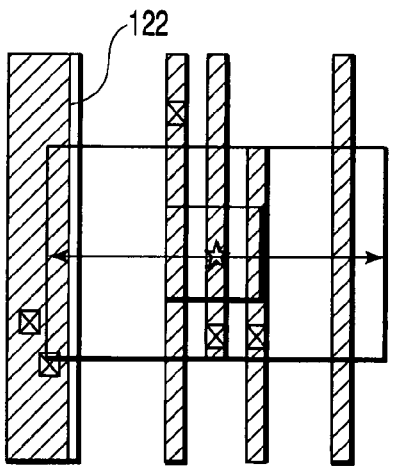

In this example, because of the optical effect of an exposure image of a thick line 121, the center of the line shown by an error marker becomes thinner, causing an open error. Accordingly, an edge in the specific range 120 is searched for from the hot spot and the edge 122 of the line 121, a pattern having an effect on the hot spot, is modified as shown in FIG. 12C, which makes it possible to decrease the risk of the hot spot shown by the error marker.

Information on the method of modifying a design pattern, including the amount of movement of edges and the direction for each process and on the modified class (or evaluated value) may be recorded and stored as history information in the process hot spot modifying library storage unit 205 of FIG. 2 at the time of, for example, computing the evaluated value (step S105). Consequently, the information shown in Table 9 is recorded as a process hot spot modifying library.

At the same time, the above algorithm, that is, an algorithm for working out a pattern modifying guideline (step S107), may refer to the history information held in the process hot spot modifying library storage unit 205 in determining a modified spot and the amount of modification. This makes it possible to omit the process of trial and error in modifying the layout of the same pattern and obtain the optimum modifying method.

Third Embodiment

A design layout generating method according to a third embodiment of the invention will be explained using Table 10.

In the third embodiment, edges in the vicinity of a process hot spot are grouped on a hot spot basis and hot spots are modified group by group (in a grouping modifying method) as explained in the second embodiment. The edge in a group is made applicable to correction for the edge near the hot spot as a group of edge. Edges near the hot spot are classified into the group of the edges related to the risk of hot spot, and make the edges in this group applicable to correction. The correction direction and quantity may be the same, or may differ from each other. The evaluated values after the design layout is modified by the individual processes are recorded as history information as shown in Table 10 into the process hot spot modifying library stored in the process hot spot modifying library storage unit 205.

TABLE 10

| | Process 1 | Process 2 | Process 3 | Process 4 | Process 5 | Process 6 |
|---|---|---|---|---|---|---|
| Group 1 | +5 | +4 | +6 | OK | Hot spot OFF | → |
| Group 2 | −5 | +10 | OK | Hot spot OFF | → | → |
| Group 3 | OK | Hot spot OFF | → | → | → | → |
| Group 4 | | OK | Hot spot OFF | → | → | → |
| Group 5 | −2 | +2 | 0 | +2 | +5 | OK |

Groups 1 to 5 shown in Table 10 are obtained by grouping edges in the vicinity of hot spots on a process hot spot basis. The values shown in Table 10 represent variations in the risk (or evaluated value) calculated in step S105 each time the layout is modified according to the worked-out pattern modifying guideline (step S107). When the sign is +, this means decrease in risk (or evaluated value). When the sign is −, this means increase in risk (or evaluated value).

In group 1, the risk was decreased in process 1, process 2, and process 3. In process 4, the risk disappeared (shown by OK). Therefore, in process 5 and forward, no modifying guideline was worked out for the spot.

In group 2, the risk increased in process 1. In process 2, the risk was decreased by 10. In process 3, the risk was decreased sufficiently and disappeared. Therefore, in process 4 and forward, no modifying guideline was worked out for the spot.

In group 3, the risk was decreased sufficiently and disappeared in process 1. Therefore, in process 2 and forward, no modifying guideline was worked out for the spot.

As described above, by tracing an increase and decrease in the risk as a result of modification on a group basis, it is possible to adjust the direction of modification and the amount of modification for each edge belonging to each group in working out a modifying guideline. Moreover, a modification can be made by moving an edge group collectively in a direction in which the risk decreases.

Figure 13A:
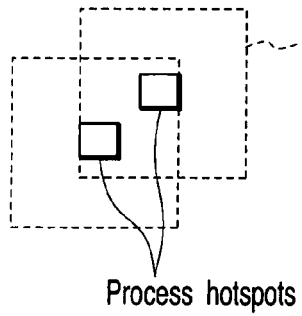
FIGS. 13A and 13B are schematic diagrams to help explain a design layout generating method according to a third embodiment of the invention.
Figure 13B:
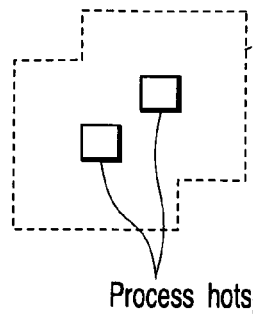

Moreover, for example, if a plurality of process hot spots have developed closed to one another or in such a manner that they partially overlap with one another as shown in FIG. 13A, the range of grouping is widened as shown in FIG. 13B and the edges following the plurality of process hot spots close to one another are handled collectively. In this case, the amount of modification of the edges in the group is determined, while the evaluated value corresponding to the plurality of process hot spots is being monitored.

Figure 14A:
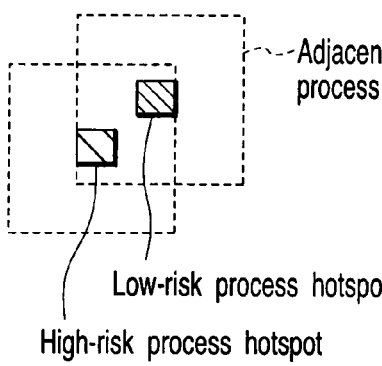
FIGS. 14A and 14B are schematic diagrams to help explain another design layout generating method according to the third embodiment.
Figure 14B:
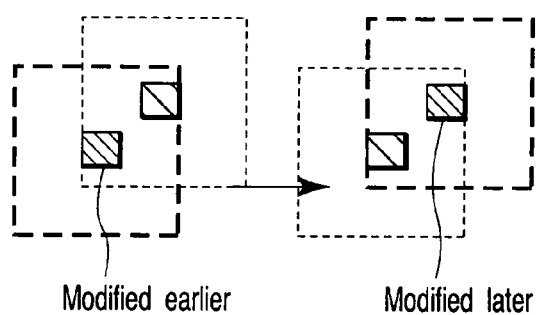

Furthermore, even if a plurality of process hot spots have developed close to one another or in such a manner that they partially overlap with one another, it is conceivable that there is a difference in risk between them as shown in FIG. 14A. In this case, the edges in the vicinity of a high-risk process hot spot may be modified earlier than those in the vicinity of a low-risk process hot spot.

In the third embodiment, too, by acquiring a history of risk (or evaluated value) as a result of layout modification by use of the process hot spot modifying library, a modifying guideline is not further worked out for a spot where the risk has been decreased sufficiently but is worked out for only a spot where the risk has been decreased insufficiently, which enables the amount of calculation to be reduced.

Furthermore, the edge layout before modification for each group and the history of modification when the risk has disappeared as a result of modification may be stored as a process hot spot modifying library into the process hot spot modifying library storage unit 205. This makes it possible to omit the process of trial and error in modifying the layout of the same pattern and obtain the optimum modifying method.

Consequently, according to the first to third embodiments, a design layout generating method capable of modifying a design pattern of a semiconductor integrated circuit at a high speed with a high accuracy.

By storing program instructions to be executed on a computer by a design layout generating method according to the first to third embodiments into a computer-readable storage medium, a computer-readable medium can be provided.

In each of the above embodiments, the process hot spots which could not be modified by the rule-based modifying method have been modified by the modifying method using the automatic modification model based on a specified algorithm. Moreover, the process hot spots which could not be modified by the rule-based modifying method may be modified by the optimum one selected from various modifying methods on a layout basis.

Next, in an automatic process hot spot modification of a design pattern, the layout is analyzed on a hot spot basis, the optimum one of a plurality of modifying methods is selected, and a modification is made by the optimum modifying method. Alternatively, the spots which could not be modified by a first method are extracted, adjacent layouts are analyzed, the optimum one of a plurality of modifying methods is selected, and a modification is made by the optimum modifying method. This design layout generating method will be explained in more detail in a fourth to a seventh embodiment of the invention.

Fourth Embodiment

Even if the input design data is subjected to a series of modifying processes by the design layout generating methods according to the first to third embodiments, all of the data might not be modified correctly. Specifically, when a process hot spot is modified using one method, the modification might not be made for various reasons, depending on the pattern layout in the vicinity of the hot spot. The reasons include, for example, the amount of modification of the line width/space width is too large/small, a sufficient amount of modification cannot be secured at a specified spot because of the limitation of the design rules, and keeping the hierarchical structure prevents a modification from being made.

If the amount of modification of the space width is so small that a sufficient amount of modification cannot be secured, the process margin is small and a process hot spot where a short error is liable to occur on the wafer develops. The table (or pattern modification table) shown in Table 6 was referred to from the dimensions to be formed on the wafer and the pattern layout situation and a modification was made to widen the space by moving the right-side edge 10 nm. However, when the dimensions on the wafer were estimated for the modified pattern, it was found that the space dimensions were still insufficient and there was insufficient process margin.

Even if an attempt is made to modify a short error in the local interconnect layer, a modification might not be made because of the limitation of the design rules.

Moreover, even if an attempt is made to modify an open error in the intermediate interconnect layer, a modification might not be made because of the limitation of the design rules for surrounding figures in the same layer.

Furthermore, even if an attempt is made to modify an open error in the intermediate interconnect layer in a mode of modifying no edge, a modification might not be made.

As described above, there may be a hot spot which cannot be modified by one modifying method. This problem includes various causes and a wide variety of optimum modifying methods is available to overcome the problem.

A conventional process hot spot modification is made in, for example, the following procedure: first, the process hot spot information, design rules, design data, and modification table are input to the automatic design modifying tool, which works out a pattern modifying tool. Next, the layout is modified, thereby creating the modified design data. At this time, information on the unmodified process hot spots is output together with information on the modified hot spot. Then, they are shipped together with the modified design data.

The user considers the cause of and measures against the unmodified spots and modifies the layout manually. Alternatively, the user adjusts the modifying guideline, the modification table, and the design data and carries out the processing again, starting at a suitable spot. If process hot spots remain after the modification, it takes a lot of time to make an adjustment and carry out the processing again.

Figure 15:
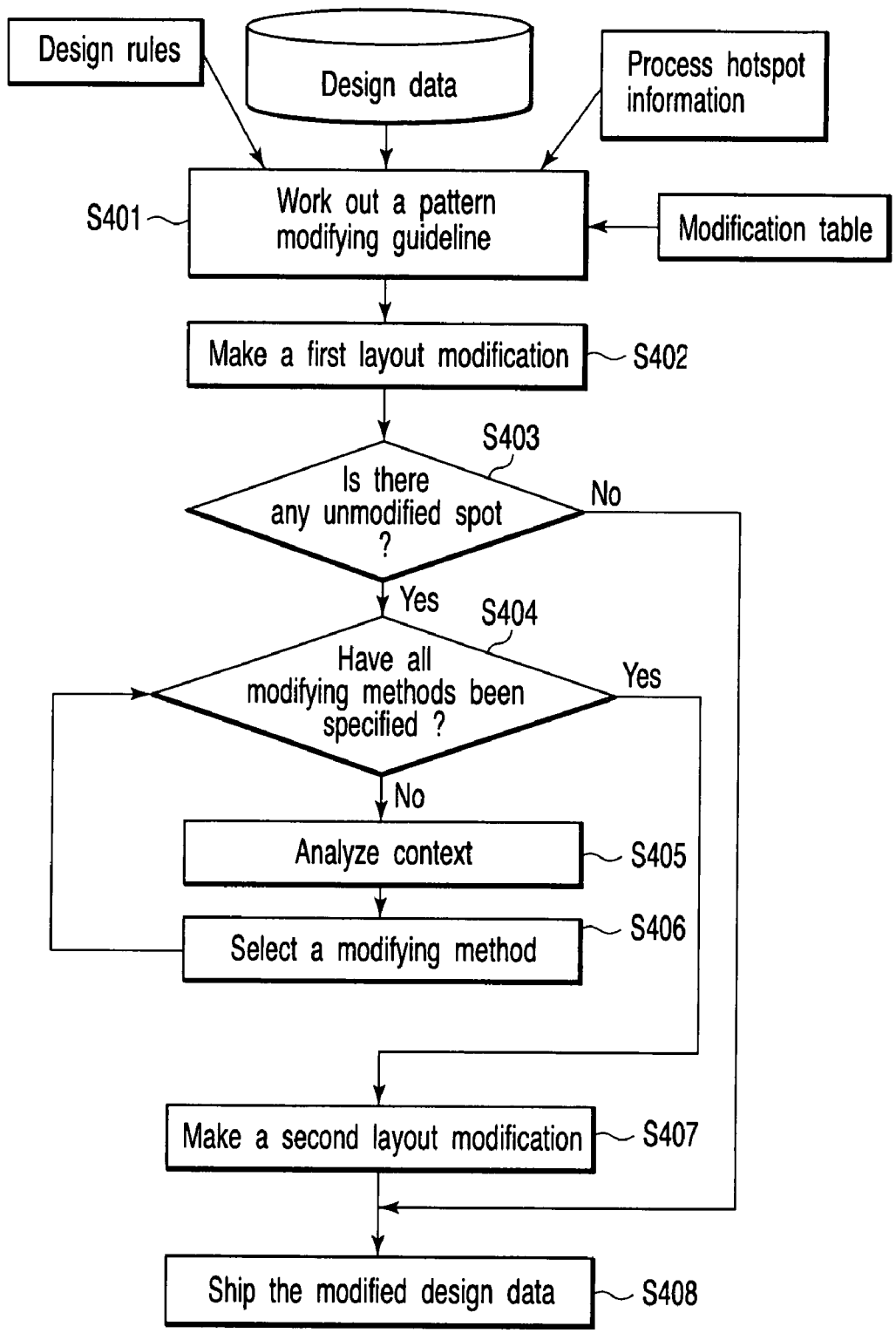
FIG. 15 is a flowchart to help explain a design layout generating method according to a fourth embodiment of the invention, showing an example of the flow of modifying process hot spots.

Next, a design layout generating method according to the fourth embodiment will be explained using FIG. 15. FIG. 15 shows an example of the flow of modifying process hot spots. In the fourth embodiment, the layout is analyzed on a hot spot basis in an automatic process hot spot modification of the design pattern, the optimum one of a plurality of modifying methods is selected, and a modification is made by the optimum method. Alternatively, the spots which could not be modified by a first method are extracted, adjacent layouts are analyzed, the optimum one of a plurality of modifying methods is selected, and a modification is made by the optimum modifying method. With this method, more hot spots are modified in a shorter period of time and a high-quality layout is generated.

First, the process hot spot information, design rules, design data, and modification table are input to the automatic design modifying tool, which works out a pattern modifying tool (step S401). Next, a first layout modification is made (step S402). Then, it is determined whether there are unmodified hot spots (step S403) and whether all of the modifying methods have been specified (step S404). If there are unmodified spots, the adjacent layout (context) is analyzed for each of the unmodified spots (step S405) and the optimum modifying method is selected (step S406). Then, after the optimum modifying method is selected for each of all the unmodified spots, a second layout modification is made (step S407). Then, the modified design data is shipped (step S408).

Before shipment, the processes, including mask data processing, OPC, RET, and simulation, may be carried out to make sure there is no process hot spot left.

Figure 16:
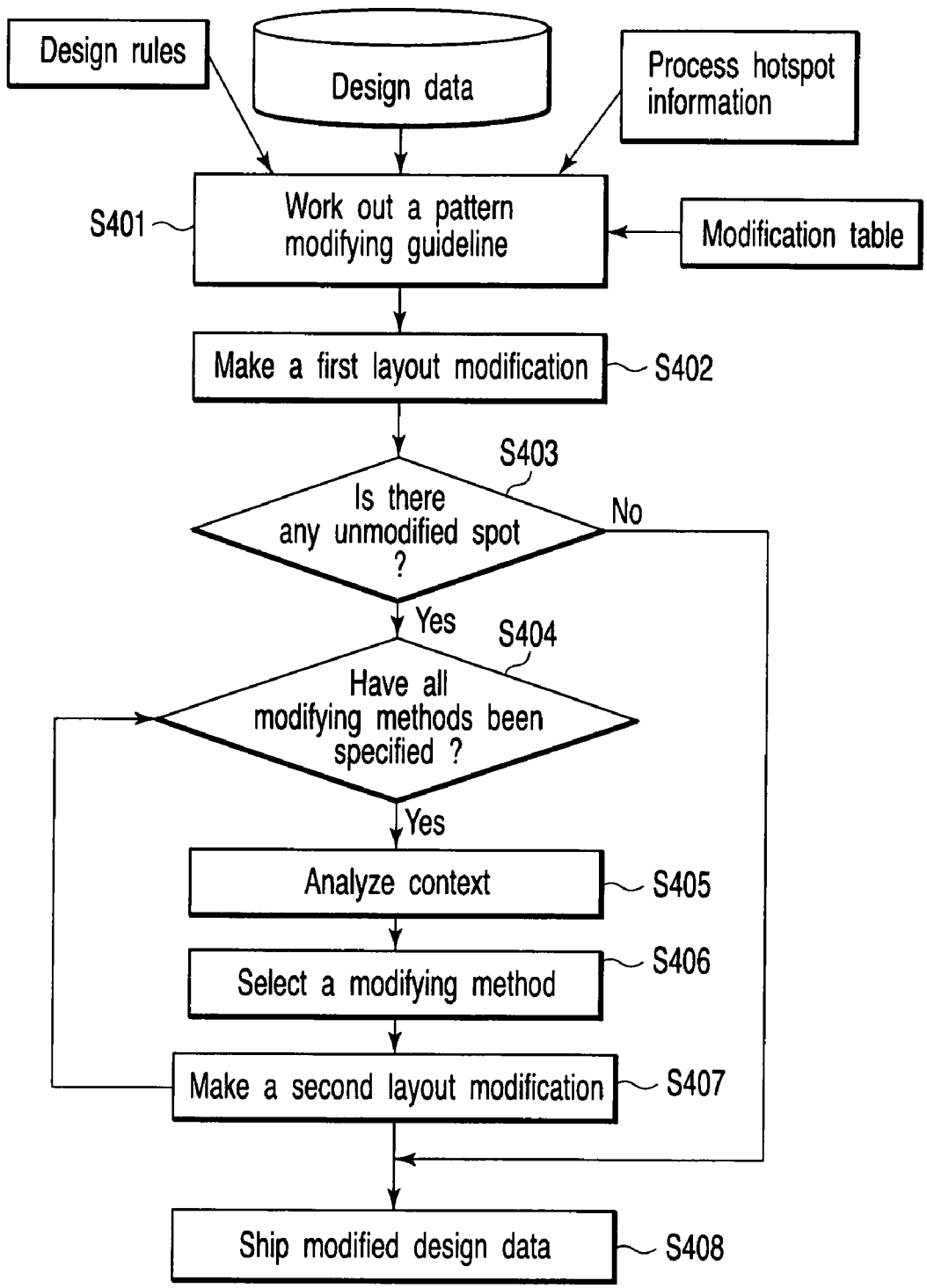
FIG. 16 is a flowchart to help explain another design layout generating method according to the fourth embodiment, showing an example of the flow of modifying process hot spots.

Moreover, as shown in FIG. 16, a modifying method may be selected for each of all the unmodified spots and the spot may be modified by the selected method.

Furthermore, in extracting unmodified spots, the remaining hot spots may be extracted using a process simulator.

Fifth Embodiment

Figure 17:
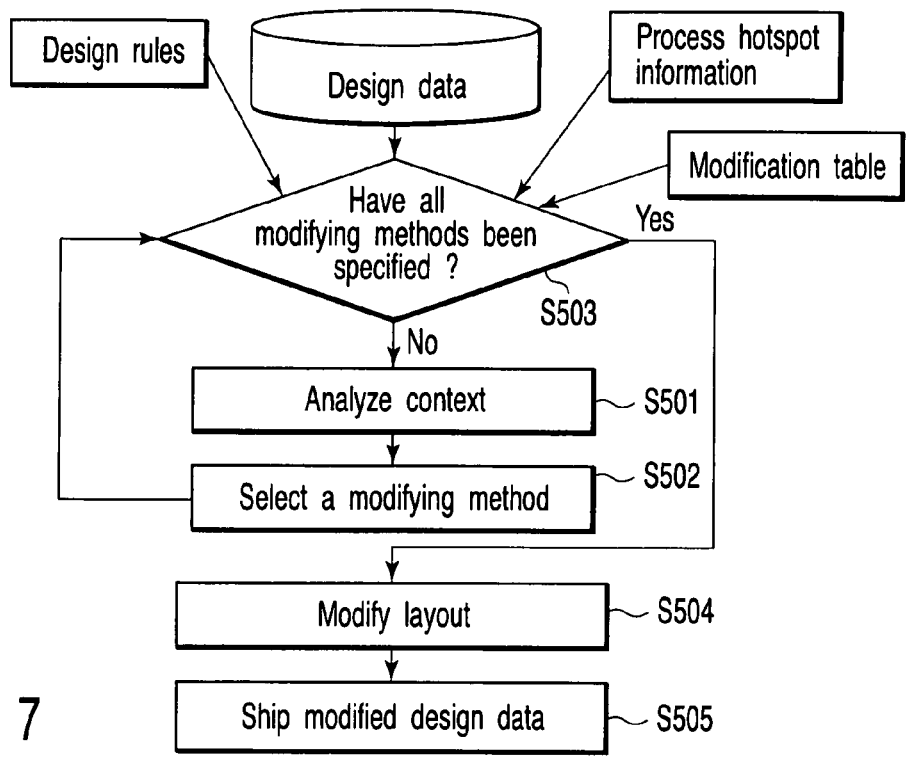
FIG. 17 is a flowchart to help explain a design layout generating method according to a fifth embodiment of the invention, showing an example of the flow of modifying process hot spots.

A design layout generating method according to a fifth embodiment of the invention will be explained using FIG. 17. FIG. 17 shows another flow of modifying process hot spots. The process hot spot information, design rules, design data, and modification table are input to the automatic design modifying tool, adjacent layouts (context) are analyzed on a hot spot basis (step S501), and the optimum modifying method is selected (step S502). Then, it is determined whether the optimum modifying method has been specified for each of all of the unmodified spots (S503). After the optimum modifying method is selected for each of all the unmodified spots, a layout modification is made (step S504). Then, the modified design data is shipped (step S505).

Before shipment, the processes, including mask data processing, OPC, RET, and simulation, may be carried out to make sure there is no process hot spot left.

Figure 18:
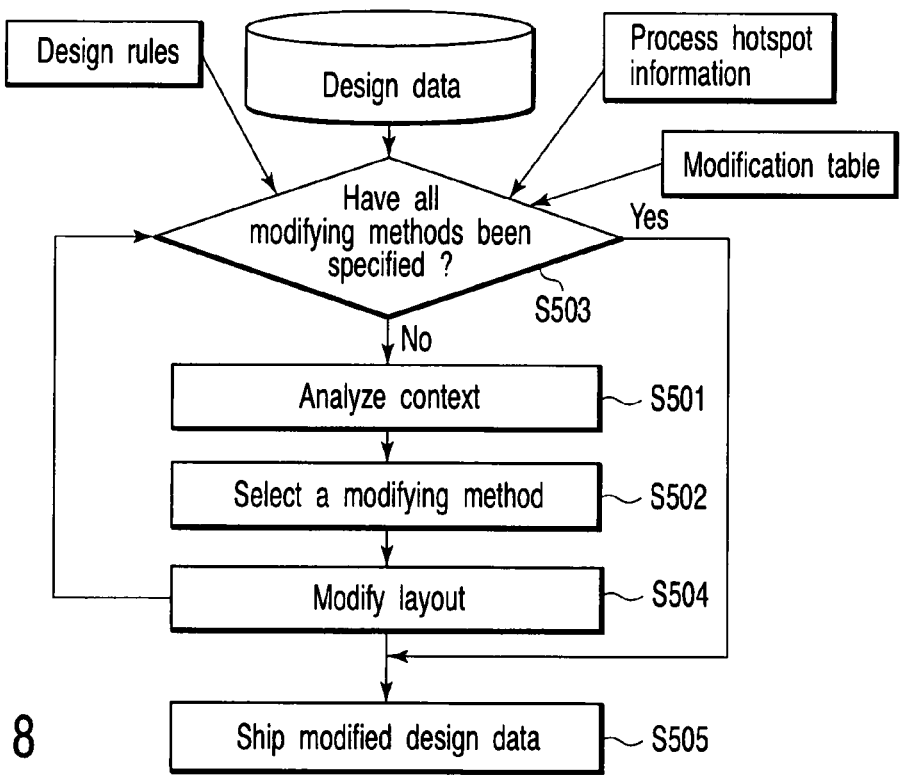
FIG. 18 is a flowchart to help explain another design layout generating method according to the fifth embodiment, showing another example of the flow of modifying process hot spots.

Moreover, as shown in a flowchart in FIG. 18, a modifying method may be selected for each of all the unmodified spots and a modification may be made by the selected method.

Sixth Embodiment

FIGS. 19A and 19B show a case where context is analyzed, the optimum modifying method is selected, and a modification is made by the selected method. When an object to be modified is limited to an interconnect layer in modifying hot spots in an interconnect layer (hatched area), although a short error (★ sign) has occurred between two interconnect layers in the case of FIG. 19A, there is a limit to the position of the contact hole layer between the interconnect line and the polysilicon layer (an outlined box on a colored background) and therefore a modification cannot be made. In contrast, in the step of analyzing context and selecting a modifying method, a contact hole layer and a polysilicon layer are added to the layer to be moved. As a result, the hot spot is modified as shown in FIG. 19B. That is, by analyzing the context, or the design layout, it is automatically determined which layout layer should be modified to remove a hot spot effectively. Then, a modification policy is determined. At the time of modification, the number of pattern edges to be moved may increase or decrease (or the number of layers to be moved may be increase or decrease) before and after the determination.

Moreover, FIGS. 20A and 20B show another case where context is analyzed, the optimum modifying method is selected, and a modification is made by the selected method. When an object to be modified is limited to figures in the vicinity of hot spots in modifying hot spots in an interconnect layer (hatched area), although an open error (★ sign) has occurred at an end of a line in the case of FIG. 20A, the figure on which a hot spot lies and the surrounding figures have been designed with the line width and space complying with the minimum design rules and there is no room for thickening the line width, preventing a modification from being made. In contrast, in the step of analyzing context and selecting a modifying method, design-rule easing rules whereby the rules for the line width and space width are eased are applied. As a result, as shown in FIG. 20B, the hot spot is modified by easing the line widths and space widths of the pattern to be modified and its adjacent patterns.

Figure 21A:
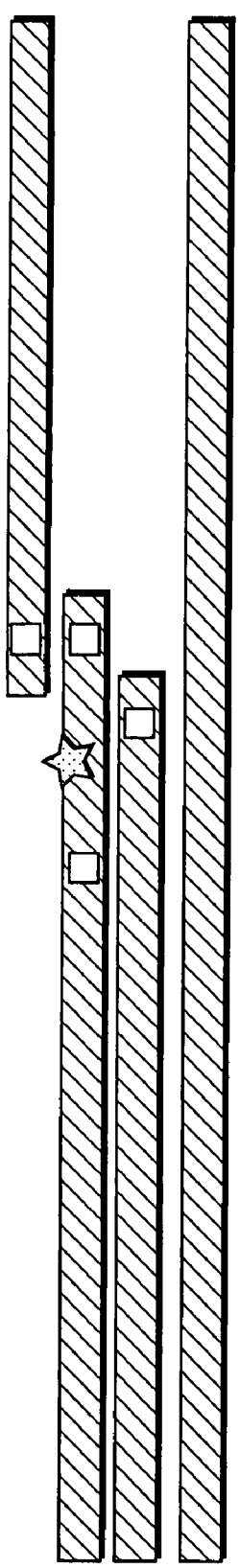
FIGS. 21A and 21B are pattern plan views showing other examples of analyzing context, selecting an appropriate modifying method, and making a modification.
Figure 21B:
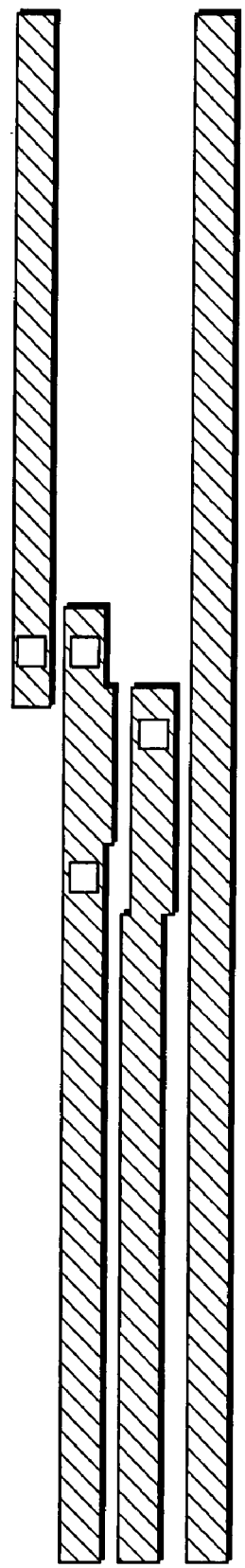

Furthermore, FIGS. 21A and 21B show another case where context is analyzed, the optimum modifying method is selected, and a modification is made by the selected method. When a modification involving no jog division whereby the pattern edge is divided at specific intervals is made in modifying hot spots in an interconnect layer (hatched area), although an open error (★ sign) has occurred near an end of a line in the case of FIG. 21A, the figure on which a hot spot lies and the surrounding figures have been designed with the line width and space complying with the minimum design rules and there is no room for thickening the line width, preventing a modification from being made. In contrast, in the step of analyzing context and selecting a modifying method, a jog-added modifying method of adding jogs to the pattern edge and making a modification on a jog basis is applied. As a result, as shown in FIG. 21B, the hot spot is modified by modifying the jogs of a pattern to be modified in the vicinity of a hot spot.

Seventh Embodiment

Figure 22:
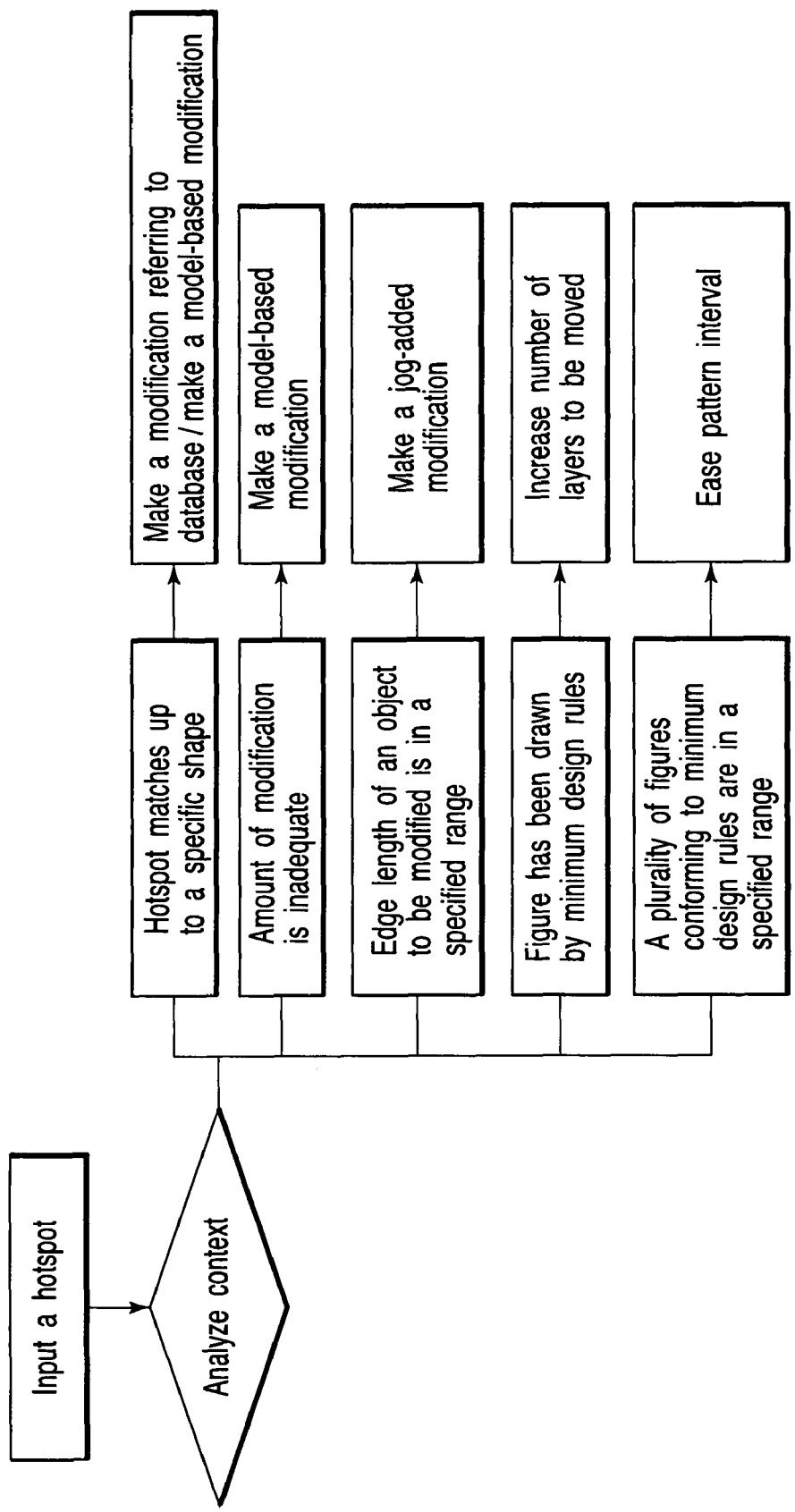
FIG. 22 is a flowchart to help explain an example of analyzing context and selecting an appropriate modifying method.

FIG. 22 shows an example of analyzing contest and selecting the optimum modifying method. When a modification area at a hot spot matches up to a specific shape (S1), a modification is made, referring to a database (in a pattern matching method), or a model-based modification is made (C1). Even when an inadequate amount of modification is applied (S2), a model-based modification is made (C2). That is, if the amount of corrections is too small, risk cannot be avoided, but a side reaction will be produced if the amount of corrections is too large. For example, if line width is made wide too much in order to correct an open error, it will short-circuit with a contiguity pattern with a side reaction. If a space width is extended too much in order to correct a short error, a line opens with a side reaction. If the edge length of an object to be modified is in a specified range (S3), a jog-added modification is made (C3). When a modification area or an area including the modification area has been drawn by the minimum design rules (S4), the number of layers to be moved is increased. When the number of patterns drawn by the minimum design rules in an area to be modified is equal to or larger than a specified number in a specified range (S5), the pattern interval is eased (C5). In this way, a context analysis and a suitable modifying method are selected for each of the hot spots, which enables almost all the hot spots to be modified.

With the design layout generating method according to the fourth to seventh embodiments, a modification satisfying design requirements and process requirements can be made at a high speed with a high accuracy at a spot where the process margin for the manufacture of semiconductor devices is small. Moreover, since the optimum modifying method can be applied to each layout, it is possible to improve the modified rate, while maintaining the quality of the layout. Consequently, the turnaround time in creating design data can be shortened, the cost can be reduced, and the fabrication yield can be improved.

When a semiconductor device is manufactured using the design layout generating method according to the fourth to seventh embodiments, a photoresist layer is formed on a processed material. The photoresist layer is exposed using a photomask formed by the design layout generating method. Then, the exposed photoresist is developed, thereby forming a resist pattern. Using the resist pattern as at least a part of the mask, the processed material is patterned. This provides a semiconductor device manufacturing method of manufacturing semiconductor integrated circuit devices by the design layout generating method according to the fourth to seventh embodiments.

Furthermore, a computer-readable medium can also be provided by storing program instructions to be executed on a computer into a computer-readable storage medium in the design layout generating method according to the fourth to seventh embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A design layout generating method, the method including:
    modifying, using a computer, a first design pattern for a semiconductor device, included in a first modification area extracted from a design layout by a first modifying method; and
    modifying, using the computer, a second design pattern for the semiconductor device, included in a second modification area extracted from the design layout by a second modifying method on the basis of a pattern modifying guideline calculated from at least a partial design layout in the second modification area, such that the second modification area includes the first modification area,
    wherein, when two second modification areas extracted from a design layout are close to each other or parts of them overlap with each other, the two second modification areas are put together into a single second modification area.

2. The design layout generating method according to claim 1, wherein the pattern modifying guideline is calculated by a specified algorithm.

3. The design layout generating method according to claim 1, wherein the first modifying method is a method of making a modification by referring to a rule table in which a modifying guideline has been determined for design layouts.

4. The design layout generating method according to claim 1, wherein the second modifying method includes any one of a model-based modifying method, a group modifying method, a pattern matching modifying method, a jog division modifying method, a pattern interval easing modifying method, a modifying method involving increase and decrease of a number of layers to be moved, and a design-rule easing modifying method.

5. The design layout generating method according to claim 1, wherein, if the pattern formed on the wafer according to the design layout modified by the second modifying method does not satisfy a specified evaluated value, further modifying the design layout modified by the second modifying method.

6. The design layout generating method according to claim 5, wherein, when the design layout modified by the second modifying method is further modified, modifying the design layout on the basis of a pattern modifying guideline newly worked out referring to the pattern modifying guideline used in the second modification.

7. The design layout generating method according to claim 1, wherein the first modification area includes a design layout area where an evaluated value calculated on the basis of a pattern formed on the wafer according to the design layout does not satisfy a specified value in the design layout, and
the second modification area includes an area where an evaluated value calculated on the basis of a pattern formed on the wafer according to the design layout modified by the first modifying method does not satisfy a specified value in the design layout modified by the first modifying method.

8. The design layout generating method according to claim 7, wherein the evaluated value of the design layout is calculated on the basis of a process margin of the pattern formed on the wafer.

9. The design layout generating method according to claim 7, wherein the two or more second modification areas extracted from the design layout are modified in order of increasing the evaluated values of their design layouts located in the second area.

10. A design layout generating method, the method including:
modifying, using a computer, a first design pattern for a semiconductor device, included in a first modification area extracted from a design layout by a first modifying method; and
modifying, using the computer, a second design pattern for the semiconductor device, included in a second modification area extracted from the design layout by a second modifying method on the basis of a pattern modifying guideline calculated from at least a partial design layout in the second modification area, such that the second modification area includes the first modification area,
wherein the first and second modifying methods are so configured that an evaluated value calculated on the basis of a pattern formed on a wafer according to a design layout modified by the first modifying method is higher than an evaluated value calculated on the basis of a pattern formed on the wafer according to a design layout before modification by the first modifying method and that an evaluated value calculated on the basis of a pattern formed on the wafer according to a design layout modified by the second modifying method is higher than an evaluated value calculated on the basis of a pattern formed on the wafer according to a design layout before modification by the second modifying method.

11. A non-transitory computer-readable medium configured to store program instructions for execution on a computer, the program instructions causing the computer to perform:
modifying, using the computer, a first design pattern for a semiconductor, included in a first modification area extracted from a design layout by a first modifying method; and
modifying, using the computer, a second design pattern for the semiconductor device, included in a second modification area extracted from the design layout by a second modifying method on the basis of a pattern modifying guideline calculated from at least a partial design layout in the second modification area, such that the second modification area includes the first modification area,
wherein, when two second modification areas extracted from a design layout are close to each other or parts of them overlap with each other, the two second modification areas are put together into a single second modification area.

12. A non-transitory computer-readable medium configured to store program instructions for execution on a computer, the program instructions causing the computer to perform:
modifying, using the computer, a first design pattern for a semiconductor, included in a first modification area extracted from a design layout by a first modifying method; and
modifying, using the computer, a second design pattern for the semiconductor device, included in a second modification area extracted from the design layout by a second modifying method on the basis of a pattern modifying guideline calculated from at least a partial design layout in the second modification area, such that the second modification area includes the first modification area,
wherein the first and second modifying methods are so configured that an evaluated value calculated on the basis of a pattern formed on a wafer according to a design layout modified by the first modifying method is higher than an evaluated value calculated on the basis of a pattern formed on the wafer according to a design layout before modification by the first modifying method and that an evaluated value calculated on the basis of a pattern formed on the wafer according to a design layout modified by the second modifying method is higher than an evaluated value calculated on the basis of a pattern formed on the wafer according to a design layout before modification by the second modifying method.

* * * * *